(12) United States Patent
Yamazaki et al.

(10) Patent No.: US 6,809,012 B2
(45) Date of Patent: Oct. 26, 2004

(54) METHOD OF MAKING A THIN FILM TRANSISTOR USING LASER ANNEALING

(75) Inventors: Shunpei Yamazaki, Atsugi (JP); Satoshi Murakami, Atsugi (JP); Hideto Ohnuma, Atsugi (JP); Osamu Nakamura, Atsugi (JP); Koichiro Tanaka, Atsugi (JP); Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 50 days.

(21) Appl. No.: 10/034,498

(22) Filed: Jan. 3, 2002

(65) Prior Publication Data

US 2002/0094613 A1 Jul. 18, 2002

(30) Foreign Application Priority Data

Jan. 18, 2001 (JP) ........................................ 2001-010858

(51) Int. Cl.[7] .............................................. H01L 29/47
(52) U.S. Cl. ........................ 438/473; 438/482; 438/488; 257/51; 257/52
(58) Field of Search ................................. 438/482, 486, 438/487, 488, 473; 257/51, 52, 57, 66, 72

(56) References Cited

U.S. PATENT DOCUMENTS

| 5,308,998 | A | 5/1994 | Yamazaki et al. |
| 5,643,826 | A | 7/1997 | Ohtani et al. |
| 5,913,112 | A | 6/1999 | Yamazaki et al. |
| 5,923,962 | A | 7/1999 | Ohtani et al. |
| RE36,314 | E | 9/1999 | Yamazaki et al. |
| 5,962,870 | A | 10/1999 | Yamazaki et al. |
| 6,285,042 | B1 | 9/2001 | Ohtani et al. |
| 6,331,723 | B1 | 12/2001 | Yamazaki et al. |
| 6,426,245 | B1 | 7/2002 | Kawasaki et al. |
| 6,489,222 | B2 | 12/2002 | Yoshimoto |
| 6,599,788 | B1 * | 7/2003 | Kawasaki et al. .......... 438/158 |
| 2001/0010702 | A1 * | 8/2001 | Tanaka ........................ 372/99 |
| 2001/0015441 | A1 | 8/2001 | Kawasaki et al. |
| 2001/0055830 | A1 | 12/2001 | Yoshimoto |
| 2002/0017685 | A1 | 2/2002 | Kasahara et al. |
| 2002/0024047 | A1 | 2/2002 | Yamazaki et al. |
| 2002/0094008 | A1 | 7/2002 | Tanaka |
| 2003/0024905 | A1 | 2/2003 | Tanaka |
| 2003/0086182 | A1 | 5/2003 | Tanaka et al. |
| 2003/0143337 | A1 | 7/2003 | Tanaka |
| 2003/0168437 | A1 | 9/2003 | Tanaka |

FOREIGN PATENT DOCUMENTS

| JP | 07-183540 | 7/1995 |
| JP | 10-270363 | 10/1998 |

* cited by examiner

Primary Examiner—Richard Elms
Assistant Examiner—Brad Smith
(74) Attorney, Agent, or Firm—Eric J. Robinson; Robinson Intellectual Property Law Office, P.C.

(57) ABSTRACT

The present invention is characterized in that gettering is performed such that impurity regions to which a noble gas element is added are formed in a semiconductor film and the metallic element included in the semiconductor film is segregated into the impurity regions by laser annealing. Also, a reflector is provided under a substrate on which a semiconductor film is formed. When laser light transmitted through the semiconductor film substrate is irradiated from the front side of the substrate, the laser beam is reflected by the reflector and thus the laser light can be irradiated to the semiconductor film from the read side thereof. Laser light can be also irradiated to low concentration impurity regions overlapped with a portion the gate electrode. Thus, an effective energy density in the semiconductor film is increased to thereby effect recovery of crystallinity and activation of the impurity element.

14 Claims, 24 Drawing Sheets

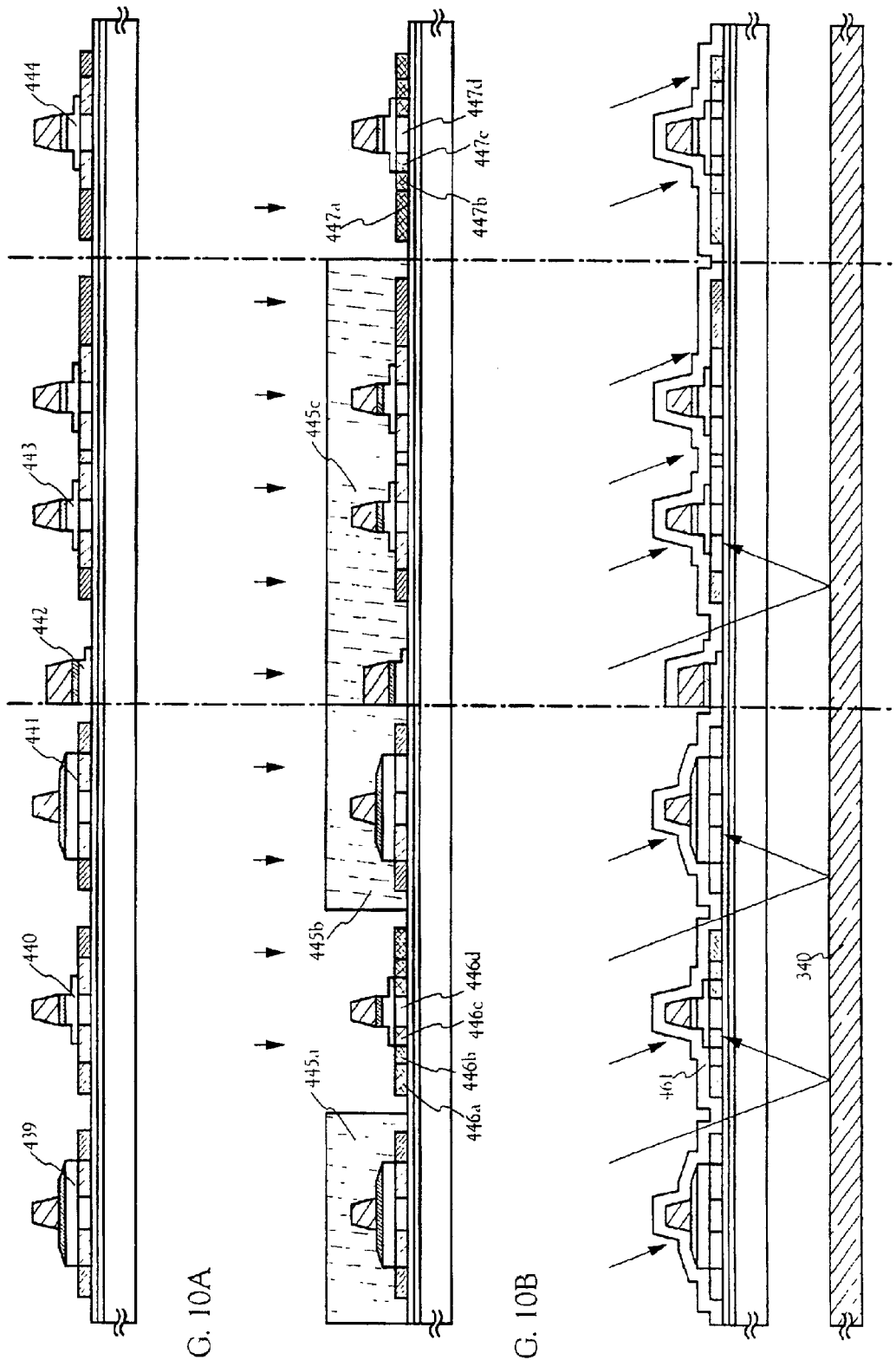

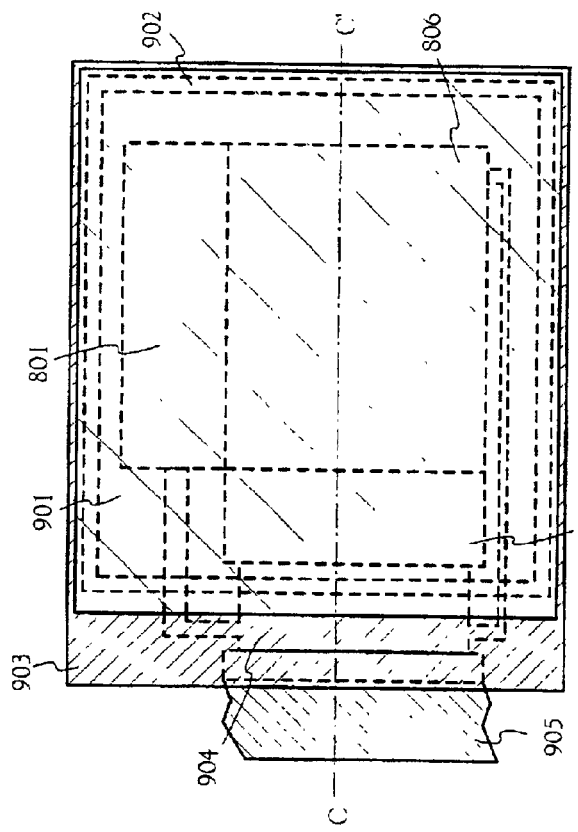
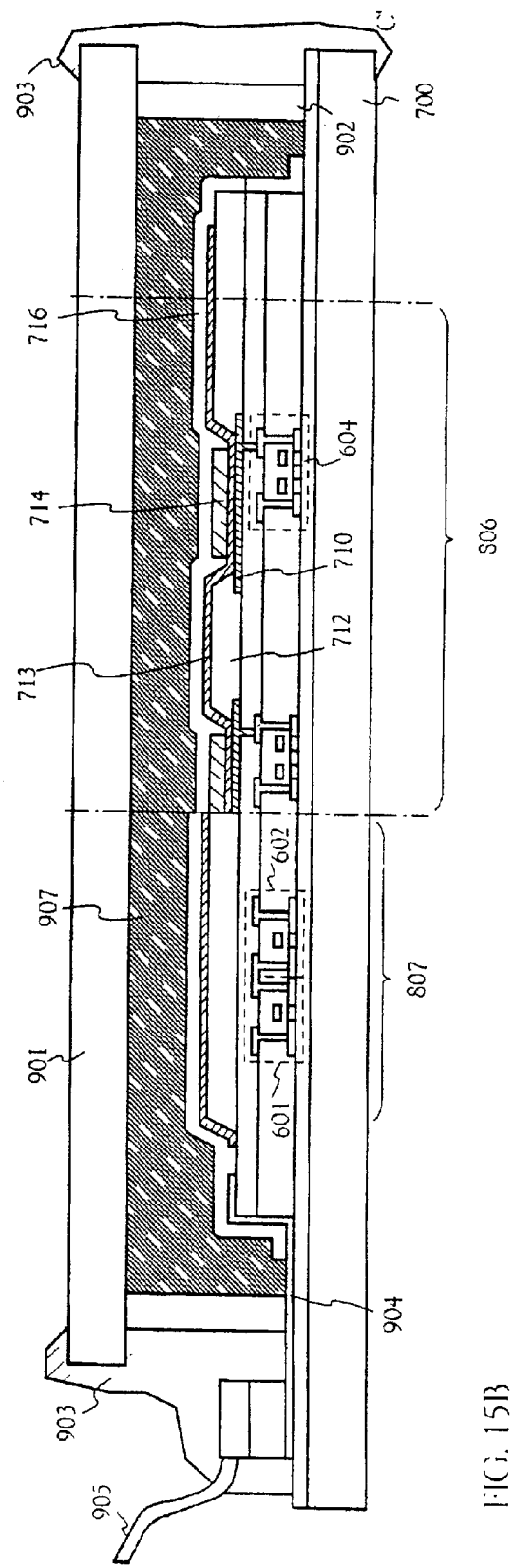
FIG. 15A
FIG. 15B

METHOD OF MAKING A THIN FILM TRANSISTOR USING LASER ANNEALING

BACKGROUND OF THE INVENTION

1. Field of the Invention

The present invention relates to a semiconductor device manufactured by including the step of annealing a semiconductor film using a laser beam (hereinafter referred to as laser annealing) and a manufacturing method thereof. Note that the semiconductor device indicated here includes an electrooptical device such as a liquid crystal display device or a light emitting device and an electronic device including the electrooptical device as a part.

2. Description of the Related Art

A technique for performing laser annealing to a semiconductor film formed on an insulating substrate made of glass or the like to crystallize it or to improve crystallinity thereof is widely studied. Silicon is often used for the above semiconductor film.

Recently, in order to improve mass production efficiency, there is remarkable movement toward enlargement of a substrate such that the standard substrate size used in production lines of newly constructed factories is now becoming 600 mm×720 mm. It is difficult with a currently available technique to process a synthetic quartz glass substrate into a substrate having such a large area. Even if that is possible, it is considered that its price cannot be reduced to a level practical for industrial use. There is, for example, a glass substrate as a material capable of easily manufacturing a large area substrate. The glass substrate has an advantage such as low cost and easiness of manufacturing the large area substrate, as compared with the synthetic quartz glass substrate frequently used in the prior art. Also, a laser is preferably used for crystallization because the melting point of the glass substrate is low. The laser can apply high energy to only a semiconductor film without largely increasing a temperature of the substrate.

There is a substrate called, for example, Corning 7059 as the glass substrate. Corning 7059 is quite inexpensive, has high processability, and can be easily enlarged in size. However, the distortion point temperature of Corning 7059 is 593° C. and a problem is caused in the case of heating at 600° C. or higher. Also, there is Corning 1737 having a relatively high distortion point temperature as one of glass substrates. The distortion point temperature of Corning 1737 is 667° C. and higher than that of Corning 7059. Even when an amorphous semiconductor film is formed on the Corning 1737 substrate and it is left at 600° C. for 20 hours, a deformation of the substrate such as to affect a manufacturing process was not observed. However, the heating time of 20 hours is too long for a mass production process. Also, it is preferable that the heating temperature of 600° C. be as lower as possible in view of a cost.

In order to solve such problems, a new crystallization method is devised. This method is described in details in Japanese Patent Application Laid-open No. Hei 7-183540. Here, this method will be briefly described. First, a trace amount of metallic element such as nickel, palladium, or lead is added to an amorphous semiconductor film. The addition method is preferably performed using plasma processing method, an evaporation method, an ion implantation method, a sputtering method, a solution coating method, or the like. After the above addition, for example, when the amorphous silicon film is left in a nitrogen atmosphere at 550° C. for 4 hours, a crystalline semiconductor film having a preferable characteristic is obtained. Heating temperature, heating time, and the like, which are suitable for crystallization are dependent on an addition amount of metallic element and a state of the amorphous semiconductor film.

However, according to the above technique, there is a problem in that the metallic element used for promoting crystallization is left also in high resistance layers (channel forming region and offset region). Since electric current can easily flow through the metallic element, a resistance of a region which should be a high resistance layer is reduced. Therefore, an off current is increased and thus variation between respective elements is produced, which causes deterioration in the stability and reliability of a TFT characteristic.

In order to solve this problem, a technique (gettering technique) for removing an metallic element for promoting crystallization from a crystalline semiconductor film is developed and disclosed in Japanese Patent Application Laid-open No. Hei 10-270363. According to the gettering technique, first, an element belonging to group 15 is selectively added to the crystalline semiconductor film and thermal treatment is performed. By this thermal treatment, the metallic element in a region to which the element belonging to group 15 is not added (gettered region) is emitted from the gettered region to be diffused and captured in a region to which the element belonging to group 15 is added (gettering region). As a result, the metallic element can be removed or reduced in the gettered region. Further, heating temperature at the gettering can be made to be 600° C. or lower which the glass substrate can withstand. Also, it is confirmed that even when not only an element belonging to group 15 but also an element belonging to group 13 is introduced, the metallic element can be gettered.

The crystalline semiconductor film formed through such manufacturing steps has high mobility. Thus, a thin film transistor (TFT) is formed using the crystalline semiconductor film and often utilized for, for example, an active matrix electric device.

In an active matrix liquid crystal display device, a pixel circuit for performing image display for each functional block and a driver circuit over a single substrate for controlling the pixel circuit composed of a shift register circuit, a level shifter circuit, a buffer circuit, a sampling circuit, and the like formed on the basis of a CMOS circuit as the basics are formed.

In the pixel circuit of the active matrix liquid crystal display device, TFTs (pixel TFTs) are arranged for each of several tens to several millions of pixels and a pixel electrode is provided in each of the pixel TFTs. An opposing electrode is provided on an opposing substrate positioned so as to sandwich the liquid crystal therebetween to thereby form a kind of capacitor using liquid crystal as dielectric. This device is configured such that a voltage applied to the respective pixels is controlled by a switching function of a TFT to control a charge to the capacitor to thereby drive the liquid crystal, and the amount of transmitting light is controlled to display an image.

The pixel TFT is made from an n-channel TFT and used as a switching element for applying a voltage to the liquid crystal to drive it. Since the liquid crystal is driven by an alternating current, a method called a frame reverse drive is employed in many cases. Since power consumption is suppressed to be low with this method, with respect to a characteristic required for the pixel TFT, it is important to sufficiently reduce an off current value (drain current flowing at an off operation of the TFT).

A low concentration drain (LDD: lightly doped drain) structure is known as a TFT structure for reducing the off current value. In this structure, a region to which an impurity element is added at a low concentration is provided between the channel forming region and the source region or the drain region, which is formed by adding an impurity element thereto at a high concentration. This region is called a LDD region. Also, a so-called GOLD (gate-drain overlapped LDD) structure in which the LDD region is overlapped with the gate electrode through a gate insulating film is known as means for preventing deterioration of an on current value due to a hot carrier. It is known that with such a structure, a high electric field near the drain is relaxed to prevent hot carrier injection and thus a deterioration phenomenon is effectively prevented.

Also, in order to obtain the GOLD structure, end portions of the gate electrode are formed in a shape having tapers. With such a shape, a step of introducing an impurity element for imparting an n-type to a semiconductor layer composing an n-channel TFT and a step of introducing an impurity element for providing a p-type to a semiconductor layer composing a p-channel TFT are respectively performed by one doping processing. Thus, the source region and the drain region are formed in a region which is not overlapped with the gate electrode and LDD regions having concentration gradients in conformity with the shape of the tapers can be formed under the tapers of the gate electrode.

Also, energy of an ion implanted into the semiconductor film in doping processing is very large as compared with bond energy of elements composing the semiconductor film. Thus, the element composing the semiconductor film is flown from a lattice point by the ion implanted into the semiconductor film to produce a defect in crystal. Therefore, after the doping processing, in order to repair the defect and simultaneously to activate the implanted impurity element, thermal treatment is performed in many cases. As the thermal treatment, there is a thermal annealing method using a furnace-annealing furnace, a laser annealing method, or a rapid thermal annealing method (RTA method). Also, the activation of the impurity element is an important process in order to produce the regions to which the impurity element is added to be low resistance regions so that they can function as the LDD regions, the source region, and the drain region.

The element belonging to group 15 is implanted into the semiconductor film by an ion doping method (which is a method of dissociating $PH_3$ or the like by plasma and accelerating an ion by an electric field to implant it into the semiconductor film, in which mass separation of an ion is basically not performed). When, for example, phosphorus is introduced for gettering, a necessary phosphorus concentration is $1 \times 10^{20}/cm^3$ or higher. The addition of the element belonging to group 15 by the ion doping method causes an amorphous state of the semiconductor film. However, an increase in a concentration of the element belonging to group 15 hinders recrystallization by later thermal treatment and thus this becomes a problem. Also, the addition of the element belonging to group 15 at a high concentration causes an extension of processing time required for the doping, which is a problem since it results in a reduction of a throughput in a doping step.

Further, the element belonging to group 15 is an impurity element for providing an n-type. It is required that a concentration of an impurity element for providing a p-type (for example, the element belonging to group 13), which is necessary to reverse a conductivity type is 1.5 times to 3 times higher than that of the element belonging to group 15, which is added to the source region and the drain region of a p-channel TFT. Thus, there is a problem in that a resistance of the source region and the drain region is increased due to the difficulty of recrystallization.

SUMMARY OF THE INVENTION

The present invention is a technique for solving such problems, and an object of the present invention is to achieve improvement of performance characteristics and reliability of a semiconductor device represented by an active matrix liquid crystal display device manufactured using TFTs, by effectively removing a metallic element left in a crystalline semiconductor film obtained using the metallic element for promoting crystallization of a semiconductor film and by performing satisfactory restoration of crystallinity of the semiconductor film and activation of the metallic element.

The present invention is characterized in that, in order to recover crystallinity of a low concentration impurity region overlapped with a portion of the gate electrode and to activate an impurity element, a substrate on which a reflecting film is formed or a reflecting plate made of a material having high reflectance (hereinafter called a reflector) are provided in a rear side (in this specification, it is defined as a surface opposite to a surface on which a semiconductor film is formed) of a substrate on which a semiconductor film is formed (hereinafter referred to as a semiconductor film substrate) and laser light is irradiated from a front side (in this specification, it is defined as a surface on which a semiconductor film is formed) of the semiconductor film substrate and the laser light transmitted through the semiconductor film substrate is reflected by the reflector and then the laser light is irradiated again, this time from the rear side of the semiconductor film substrate. At this time, the substrate may be heated to about 450° C. When the substrate is heated simultaneous with the irradiation of laser light, the recovery of crystallinity of the semiconductor film and the activation of the impurity element can be more effectively performed.

The low concentration impurity region described above is a region into which an impurity of one conductivity type is introduced. The element belonging to (group 15 or the element belonging to group 13 is used as the one conductivity type impurity. In addition, hydrogen may be added to the low concentration impurity region and both one conductivity type impurity and hydrogen are included in the low concentration impurity region.

Also, the element belonging to group 15 and the element belonging to group 13 may be added to the low concentration impurity region, and thus both the element belonging to group 15 and the element belonging to group 13 are included in the impurity region.

Also, the element belonging to group 15, the element belonging to group 13, and hydrogen may be added to the low concentration impurity region, and thus both the element belonging to group 15, the element belonging to group 13, and hydrogen are included in the impurity region.

Further the present invention is characterized in that a semiconductor film is crystallized using a metallic element for promoting crystallization, an impurity region to which a noble gas element (also called a noble gas) is added is formed, and the metallic element included in the semiconductor film is segregated to the impurity region by thermal treatment to thereby perform gettering, and subsequently a reflector is provided in a rear side of a semiconductor film substrate, and laser light is irradiated from a front side of the semiconductor film substrate to irradiate laser light from the rear side of the semiconductor film substrate.

When the noble gas is used, the introduction amount of impurity elements can be reduced. Thus, damages to the gate insulating film, the semiconductor film, and an interface therebetween due to doping processing can be reduced and trap centers can be decreased. Therefore, reliability in manufacture of a TFT can be improved. Also, since the trap centers are decreased, a width of an overlap region between the gate electrode and the low concentration impurity region can be shortened. Thus, a transistor can be further microfabricated.

As the noble gas element, there may be used one kind or plural kinds of elements selected from the group consisting of He, Ne, Ar, Kr, and Xe. When these ions are accelerated by an electric field to introduce it into the semiconductor film, a dangling bond and a lattice distortion are produced and thus a gettering cite can be produced.

Also, one conductivity type impurity may be added to the impurity region to which the noble gas element is added, and thus both the noble gas element and one conductivity type impurity are included in the impurity region. The element belonging to group 15 or the element belonging to group 13 is applied as the one conductivity type impurity. In addition, hydrogen may be added to the impurity region, and thus the noble gas element, one conductivity type impurity, and hydrogen are included in the impurity region.

Also, the element belonging to group 15 and the element belonging to group 13 may be added to the impurity region to which the noble gas element is added, and thus the noble gas element, the element belonging to group 15, and the element belonging to group 13 are included in the impurity region.

Also, the element belonging to group 15, the element belonging to group 13, and hydrogen may be added to the impurity region to which the noble gas element is added, and thus the noble gas element, the element belonging to group 15, the element belonging to group 13, and hydrogen are included in the impurity region.

Also, the reflector may be provided in contact with the semiconductor film substrate or may be provided to be physically separated from the semiconductor film substrate.

The present invention is also characterized in that a material which is resistant to heat and has a high reflectance with respect to the laser beam is used as a material for forming the reflector. As shown in FIG. 5, the reflector may he made of an element selected from the group consisting of aluminum (Al), tungsten (W), tantalum (Ta), titanium (Ti), chromium (Cr), and silver (Ag), a compound including the element, or an alloy including the element. A reflecting film may be formed on the substrate as the reflector. Also, a reflecting plate made of a material having high reflectance may be used as the reflector.

As regards the reflector, a surface thereof by which the laser light is reflected may be a plane surface or a curved surface. The laser light is condensed on or near the surface of the semiconductor film formed on the substrate. Also, a part of the laser light is transmitted through the substrate and reflected by the reflector to be irradiated onto the semiconductor film also from a rear side thereof. At this time, when the surface of the reflector, by which the laser light is reflected, forms a plane surface, there may be a case where the laser light reflected by the reflector becomes more spread or scattered as compared with laser light incident from the front side of the semiconductor film. Thus, when the surface of the reflector by which the laser light is reflected is formed as a curved surface, laser light which is reflected from the reflector and condensed can be irradiated from the rear side of the semiconductor film and thus an effective energy density in the semiconductor film can be further increased. Since the curvature of the curved surface is dependent on a state of laser light, a distance between the substrate and the reflector, and the like, it may be appropriately determined by an operator. Also, rugged portions may be provided on a reflecting surface of the reflector to effect diffuse reflection of the laser light.

Also, when irradiating laser light to the substrate from the front side of the substrate on which the semiconductor film is formed, the substrate and the reflector may be moved relative to the laser light. Alternatively, only the substrate may be moved relative to the laser light and the reflector.

Also, it is an essential condition that the laser tight used in the present invention be able to transmit through the substrate. FIG. 6A shows transmittance of a 1737 glass substrate with respect to a wavelength and FIG. 6B shows transmittance of a synthetic quartz glass substrate with respect to a wavelength. From FIGS. 6A and 6B, if some transmittance is required for the substrate to be used, a wavelength of the laser beam is desirably 300 nm or more (preferably, 400 nm or more). Also, from FIGS. 6A and 6B, the substrate is desirably selected in accordance with the laser to be used. For example, when an XeCl excimer laser (308 nm in wavelength) is used, since the transmittance of the synthetic quartz glass substrate is higher than that of the 1737 glass substrate, it is preferable to use the synthetic quartz glass substrate. Further, a solid laser rather than a gas laser is desirably used as the laser. This reason is as follows. That is, gas used for the gas laser is generally quite expensive, and thus when a frequency of gas exchange is high, there is a problem in that it increases manufacturing cost. Also, exchange of attached devices such as a laser tube for laser oscillation and a gas purifying unit for removing an unnecessary compound produced in an oscillation process are required once every two to three years. These attached devices are often expensive, which also causes an increase in manufacturing cost such as described above. Thus, when the solid laser (laser for outputting a laser beam using a crystal rod as a resonant cavity) such as a YAG laser is used, a running cost (here, which means a cost produced with operation) can be reduced as compared with the gas laser.

Also, when irradiating the laser light to the semiconductor film substrate from the front side of the semiconductor film substrate, the laser light may be irradiated to the semiconductor film substrate at a slant angle.

Also, when the reflector is manufactured once, it can be reused many times.

Also, there is an amorphous semiconductor film or a crystalline semiconductor film as the semiconductor film. A compound semiconductor film having an amorphous structure, such as an amorphous silicon germanium film may also be used other than the amorphous semiconductor film.

Thus, when the present invention is applied, the semiconductor film for which gettering of the metallic element, the recovery of crystallinity of the semiconductor film, and the activation of the impurity element has been satisfactorily performed can be obtained and the performance of a semiconductor device can be greatly improved. For example, in the case of a TFT, when the metallic element is sufficiently gettered, an off current value is reduced and variation in the off current value can be suppressed. Also, when the crystallinity of the semiconductor film is sufficiently recovered, the channel forming region becomes a high resistance region and a leak current can be reduced. Also, when the impurity element is sufficiently activated, the regions to which the impurity element is added are formed as low resistance regions which function as the LDD region, the source region, and the drain region.

BRIEF DESCRIPTION OF THE DRAWINGS

FIGS. 10A to 10C are cross sectional views indicating an example of manufacturing steps of the pixel TFTs and the TFTs of the driver circuit of Embodiment 5;

FIG. 15A is a top view of a light emitting device and FIG. 15B is a cross sectional structural view of a driver circuit and a pixel portion in the light emitting device of Embodiment 8;

DETAILED DESCRIPTION OF THE PREFERRED EMBODIMENTS

[Embodiment Mode]

Figures 1A, 1B:
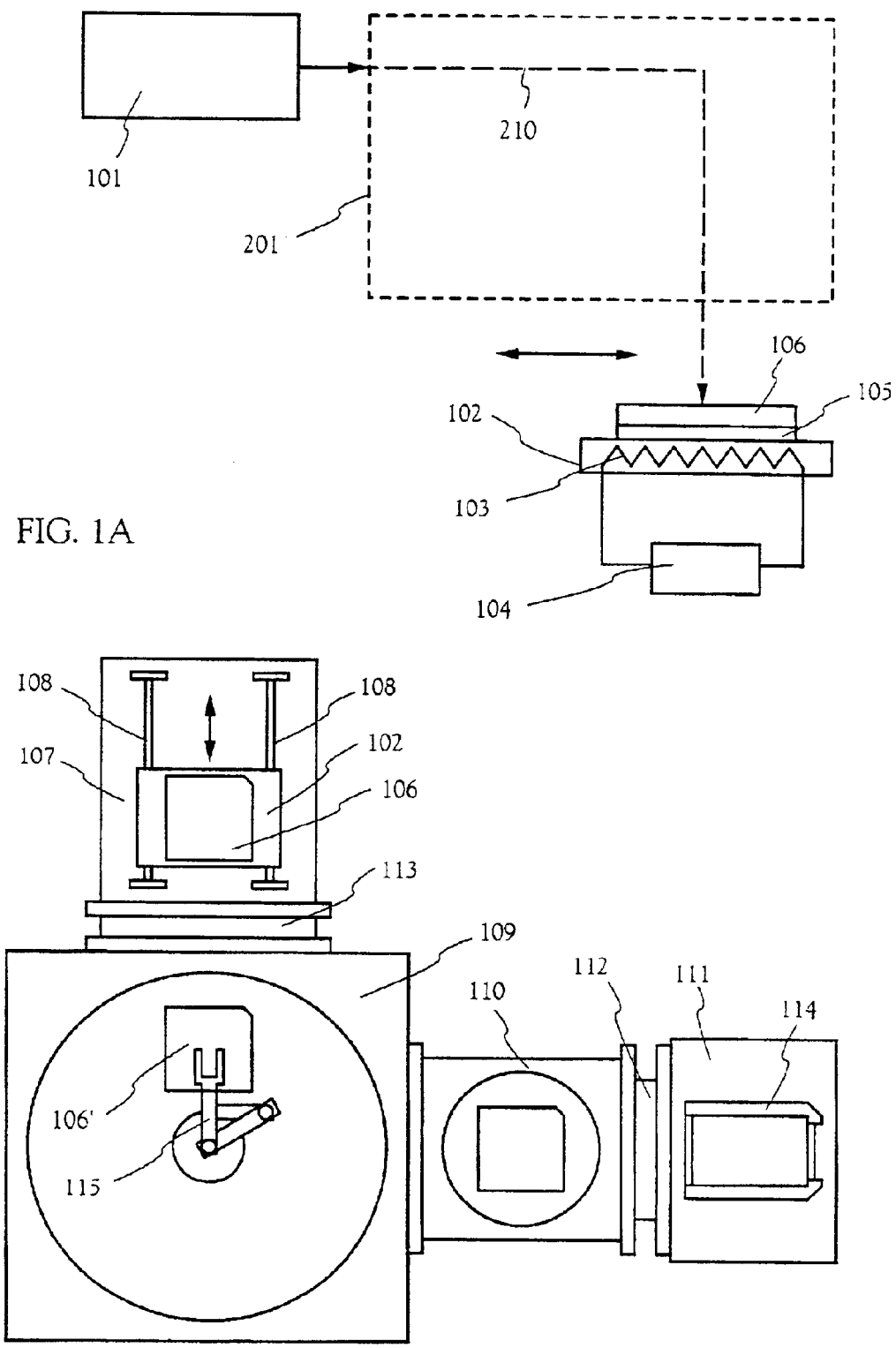
FIGS. 1A and 1B show a structure of a laser apparatus of the present invention.

An embodiment mode of the present invention will be described. FIG. 1A shows a structure of a laser irradiation apparatus. This laser irradiation apparatus has a laser oscillator 101 (Nd: YAG laser in this embodiment mode), an optical system 201 for linearly processing laser light 210 (second harmonic, third harmonic or fourth harmonic, preferably, the second harmonic) from the laser oscillator 101 as an oscillation source, and a stage 102 for holding a translucent substrate. A heater 103 and a heater controller 104 is provided in the stage 102 and thus the substrate can be heated to 450° C. Also, a reflector 105 is provided on the stage 102 and a substrate 106 on which a semiconductor film is formed is located thereon.

Note that, when the laser light outputted from the laser oscillator 101 is to he modulated to the second harmonic or the third harmonic, a wavelength modulator including a non-linear element may be provided immediately after the laser oscillator 101.

Next, a method of holding the substrate 106 in the laser irradiation apparatus having the structure as shown in FIG. 1A will be described using FIG. 1B. The substrate 106 held in the stage 102 is located in a reaction chamber 107 and then linear laser light from the laser oscillator 101 as an oscillation source is irradiated thereto. The inner portion of the reaction chamber can be made to be in a reduced pressure state or in an inert gas atmosphere by an evacuation system or a gas system (both are not shown). The semiconductor film can be heated at 100° C. to 450° C. without contaminating it.

Also, the stage 102 can be moved along guide rails 108 in the reaction chamber 107 and thus the linear laser light can be irradiated onto the entire surface of the substrate. The laser light is made incident from a window (not shown) made of quartz, which is provided in the top side of the substrate 106. In FIG. 1B, a transfer chamber 109 is connected with the reaction chamber 107, an intermediate chamber 110 is connected with the transfer chamber 109, and a load and unload chamber 111 is connected with the intermediate chamber 110. The reaction chamber 107 and the transfer chamber 109 are isolated from each other by a gate valve 113. The intermediate chamber 110 and the load and unload chamber 111 are isolated from each other by a gate valve 112.

A cassette 114 capable of holding a plurality of substrates is located in the load and unload chamber 111 and the substrate is transferred by a transfer robot 115 provided in the transfer chamber 109. A substrate 106' indicates a substrate which is being transferred. With such a structure, laser annealing processing can be successively performed in a reduced pressure state or in an inert gas atmosphere.

Figure 2A:
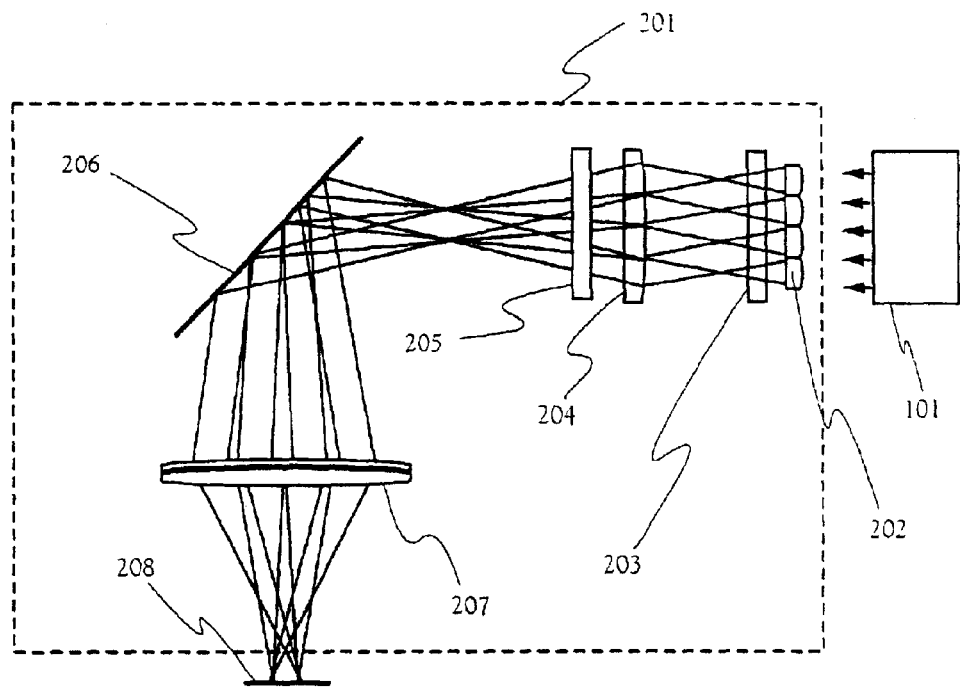
FIGS. 2A and 2B show a structure of an optical system of the laser apparatus of the present invention.
Figure 2B:
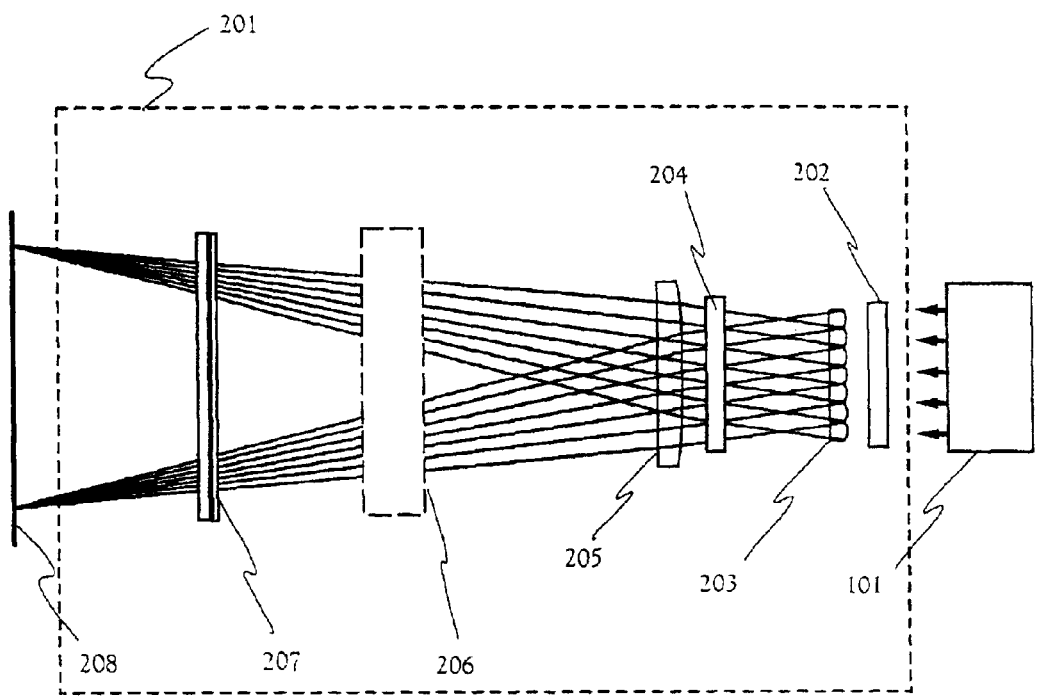

Next, a structure of the optical system 201 for processing laser light into linear light will be described using FIGS. 2A and 2B. FIG. 2A shows the optical system 201 viewed from the side and FIG. 2B shows the optical system 201 viewed from the top.

Laser light from the laser oscillator 101 as an oscillation source is divided in a vertical direction by a cylindrical array lens 202. The divided laser light is further divided in a transverse direction by a cylindrical array lens 203. That is, in the end the laser light is divided in a matrix by the cylindrical array lenses 202 and 203.

Then, the laser light is temporarily condensed by a cylindrical lens 204. Then, the laser light passes through a cylindrical lens 205 immediately after the cylindrical lens 204. After that, the laser light is reflected by a mirror 206 and passed through a cylindrical lens 207 to reach an irradiation surface 208.

At this time, the laser light projected onto the irradiation surface 208 indicates a linear irradiation surface. That is, this means that a cross sectional shape of the laser light transmitted through the cylindrical lens 207 becomes linear. Homogenization the linearly processed laser light in a width direction (short length direction) is made by the cylindrical array lens 202 and the cylindrical lenses 204 and 207. Also, homogenization of the above laser light in a length direction (long length direction) is made by the cylindrical array lens 203 and the cylindrical lens 205.

Figure 3:
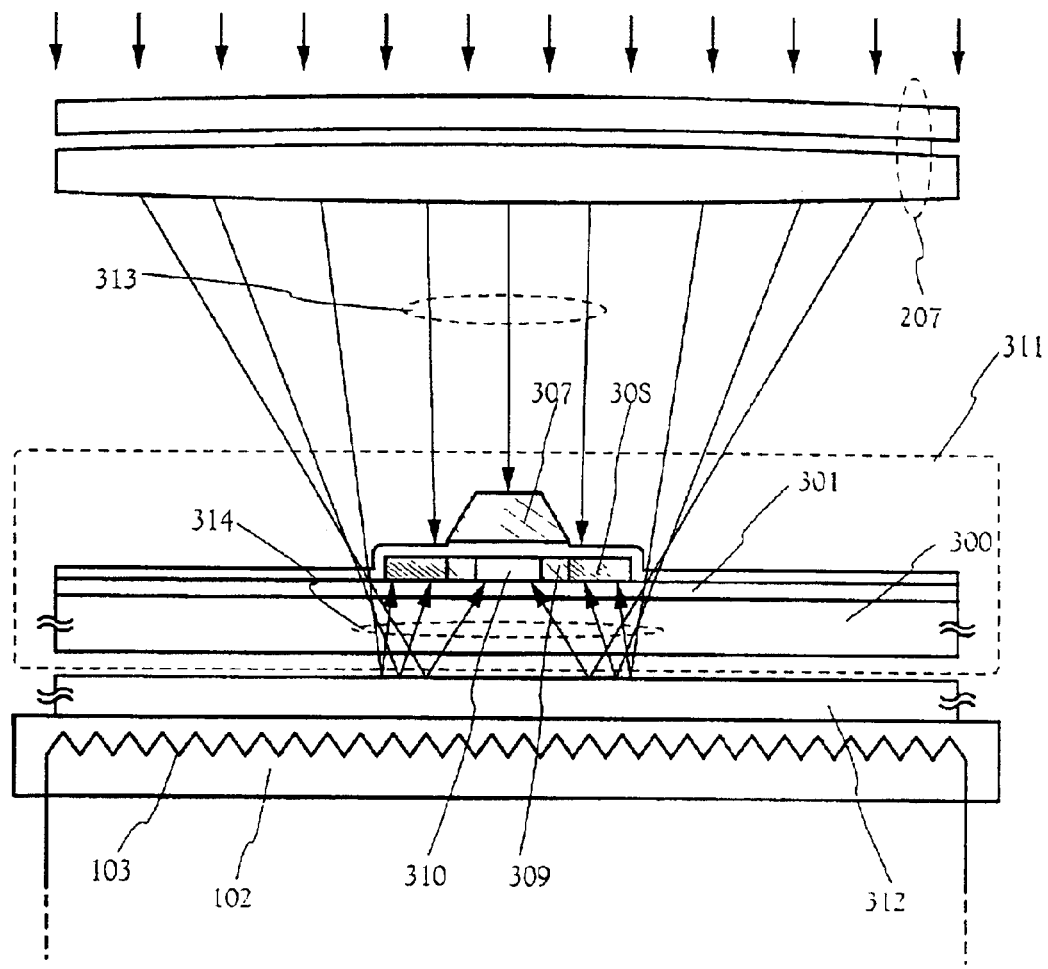
FIG. 3 shows an example of a laser annealing method of the present invention.

Next, a structure for irradiating laser light onto the semiconductor film, which is formed on the substrate, from the rear side thereof will be described using FIG. 3. FIG. 3 shows a positional relationship between the substrate 106 and the reflector 105 in FIG. 1A.

In FIG. 3, reference numeral 311 denotes a substrate with a TFT having a GOLD structure after the gate electrode is formed. Also, a reflector 312 for reflecting laser light is located under the substrate 311.

Figure 4A:
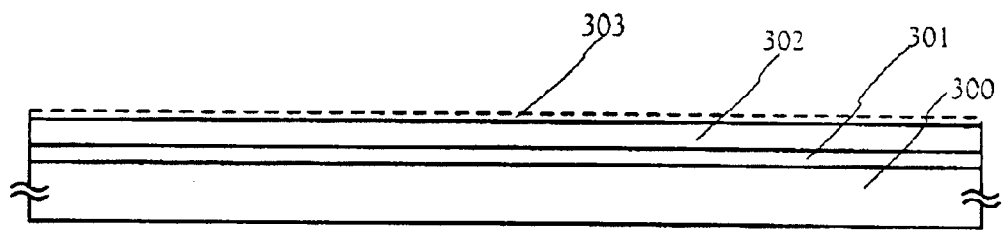
FIGS. 4A to 4C show manufacturing steps of a TFT having a GOLD structure of the present invention.
Figure 4B:
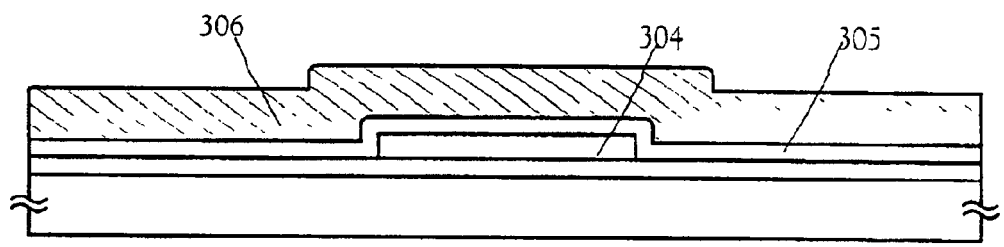
Figure 4C:
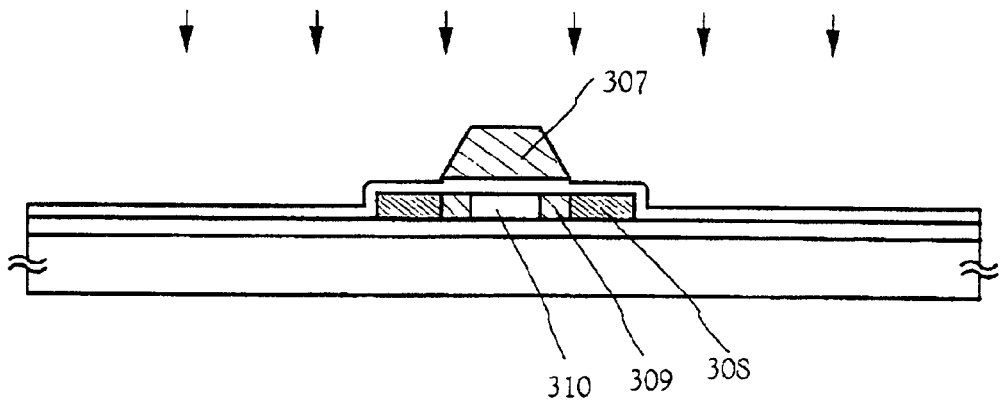
Figure 5:
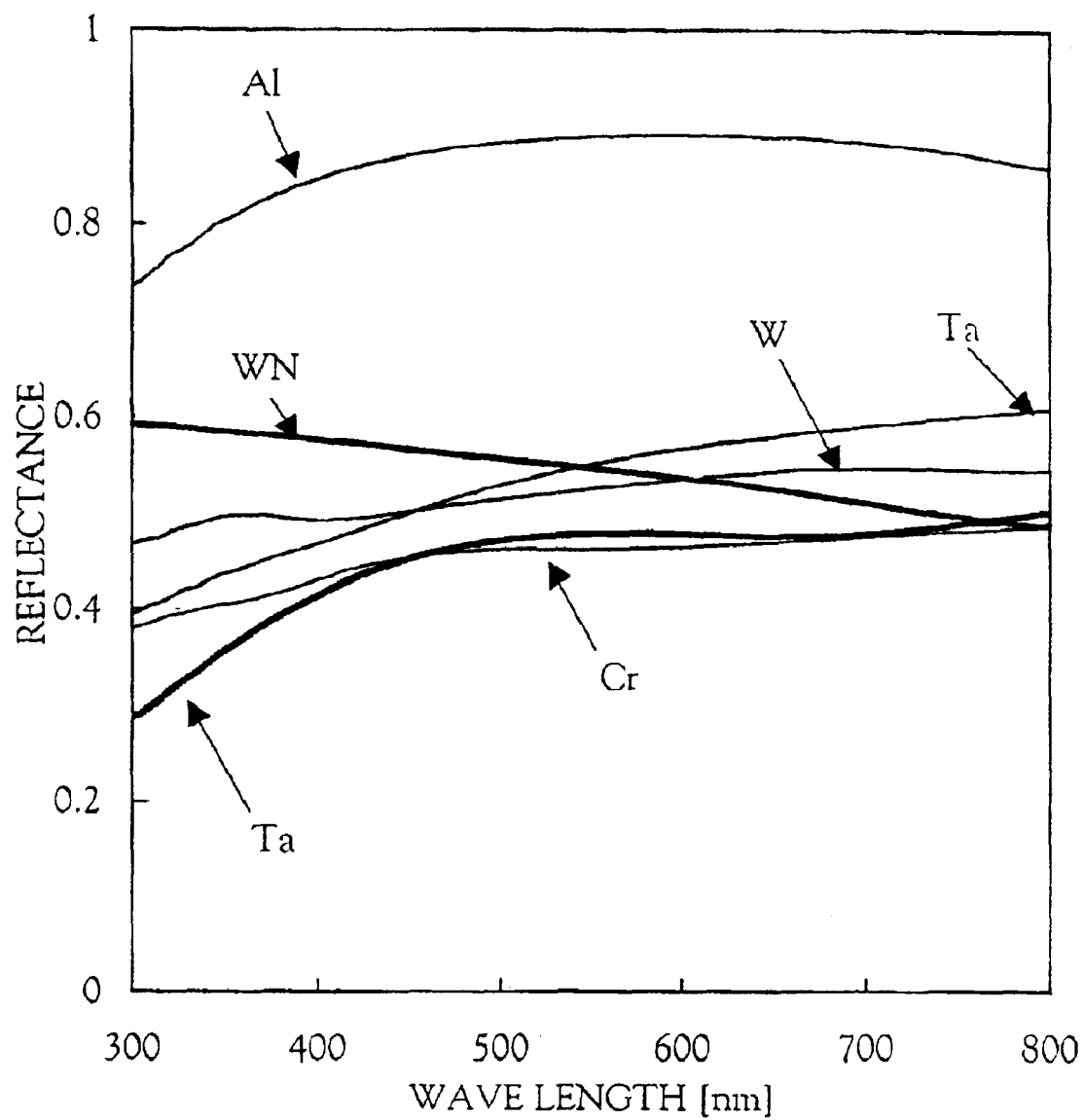
FIG. 5 is a graph indicating reflectance to a wavelength in examples of reflecting materials of the present invention.
Figure 6A:
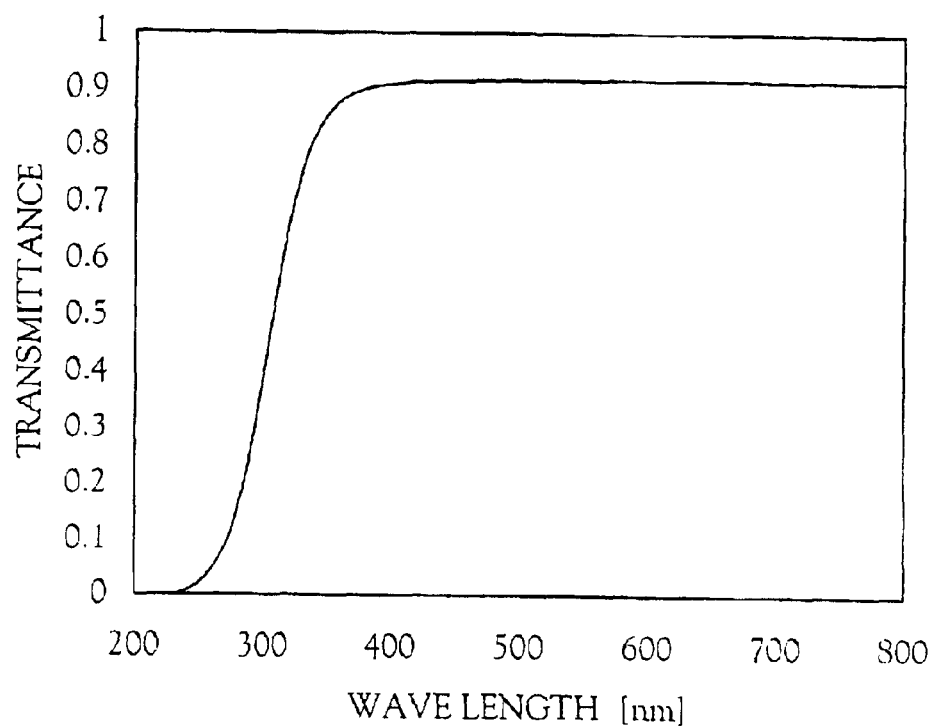
FIG. 6A is a graph indicating transmittance to a wavelength in a 1737 glass substrate and FIG. 6B is a graph indicating transmittance to a wavelength in a synthetic quartz glass substrate.
Figure 6B:
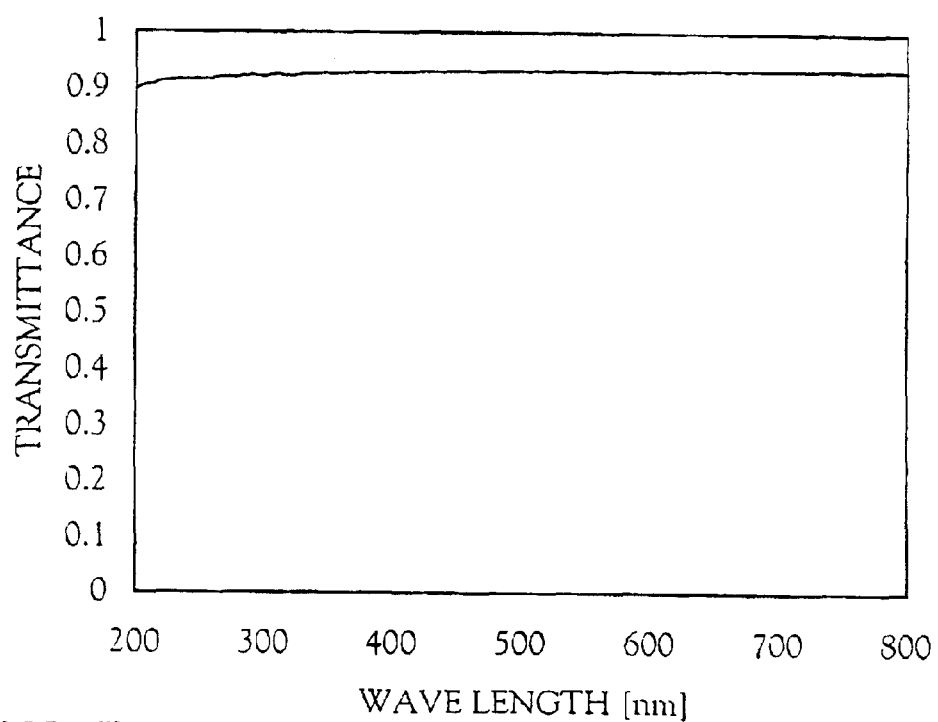

Here, a method of performing steps up to formation of the gate electrode of the TFT will be described using FIGS. 4A to 4C. First, a glass substrate, a synthetic quartz glass substrate, a crystallized glass substrate, or a plastic substrate is used as a translucent substrate 300. An insulating film including silicon such as a silicon oxide film or a silicon oxynitride film (SiOxNy), which is formed by a known process (sputtering method, LPCVD method, plasma CVD method, or the like) may be used as a base insulating film 301. Of course, other types of insulating films may be used. Also, the base insulating film may have not only a single layer structure but also a laminate structure.

Then, a semiconductor film 302 having an amorphous structure is formed at a thickness of 25 to 80 nm (preferably, 30 to 60 nm) by a known means (sputtering method, LPCVD method, plasma CVD method, or the like). A material of the semiconductor film is not limited to a specific material. However, the semiconductor film is preferably made of silicon, a silicon germanium (SiGe) alloy, or the like. After that, a metallic element for promoting crystallization (one kind or plural kinds of elements selected from the group consisting of Fe, Co, Ni, Ru, Rh, Pd, Os, Ir, Pt, Cu, Ag, Au, Sn, and Sb) is added to the semiconductor film to form a metal-containing layer 303 and thermal treatment is performed to crystallize the semiconductor film. Of course, another known crystallization method (such as a laser crystallization method) may be combined. (FIG. 4A)

After the crystallized semiconductor film is patterned to form an island-like semiconductor film 304, an insulating film including silicon such as a silicon oxide film or a silicon oxynitride film (SiOxNy) is formed as an insulating film 305 and then a conductive film 306 is formed. A material of the conductive film is not limited to a specific material. However, the conductive film may be made of an element selected from the group consisting of Ta, W, Ti, Mo, Al, Cu, Cr, and Nd, an alloy material or a compound material containing the element as its main component. A semiconductor film represented by a crystalline silicon film doped with an impurity element such as phosphorus may be used as the conductive film. Also, an AgPdCu alloy may be used. Of course, the conductive film may be made have not only a single layer structure but also a laminate structure.

Subsequently, etching is performed to form a gate electrode 307 in which tapers are formed in end portions. (FIG. 4B)

Then, doping is performed for impurity element introduction. According to the doping processing, one kind or plural kinds of elements selected from noble gas elements, and an impurity element for providing an n-type or an impurity element for providing a p-type are introduced into the semiconductor film by an ion doping method, an ion implantation method, or the like. Alternatively, one kind or plural kinds of elements selected from noble gas elements, and an impurity element for providing an n-type and an impurity element for providing a p-type may be introduced. In addition, hydrogen may also be added. Of course, a step of introducing a noble gas element maybe performed separately from a step of introducing an impurity element for providing an n-type or an impurity element for providing a p-type. By the doping processing, regions 308 into which the impurity element is introduced at a high concentration, regions 309 into which the impurity element is introduced at a low concentration due to the tapers provided in the end portions of the gate electrode, and a region (channel forming region) 310 into which the impurity element is not introduced are formed. Then, thermal treatment is performed for gettering the metallic element. By the thermal treatment, the metallic element is moved from the channel forming region to the regions to which the impurity element is added and thus the channel forming region can be made to be a high resistance region.

A method for sufficiently restoring the crystallinity of the region into which the noble gas element is introduced is shown in FIG. 3.

Here, the reflector 312 may be a substrate such that a metallic film is formed on the surface thereof (reflecting surface of laser light) or may be a reflecting plate made of a material having high reflectance. In this case, any material may be used for the metallic film. Typically, a metallic film including any element selected from the group consisting of aluminum, silver, tungsten, titanium, and tantalum is used.

Also, instead of disposing the reflector 312, the metallic film such as described above may be directly formed on the rear surface (surface opposite to the front surface) of the substrate 300 to thereby reflect laser light. Note that this structure is allowed on the condition that the metallic film formed on the rear surface is not removed in a manufacturing process of a semiconductor device.

Then, the laser light linearly processed through the optical system 201 (of which only the cylindrical lens 207 is shown in the drawings) described using FIGS. 2A and 2B is irradiated also to the semiconductor film located under the gate electrode 307.

At this time, the laser light irradiated to the semiconductor film includes laser light 313 directly irradiated thereto after passing through the cylindrical lens 207 and laser light 314 irradiated thereto after it is reflected by the reflector 312. Note that in this specification, laser light irradiated onto the surface of the reflector is called first laser light and laser light reflected by the reflector is called second laser light.

Figure 24:
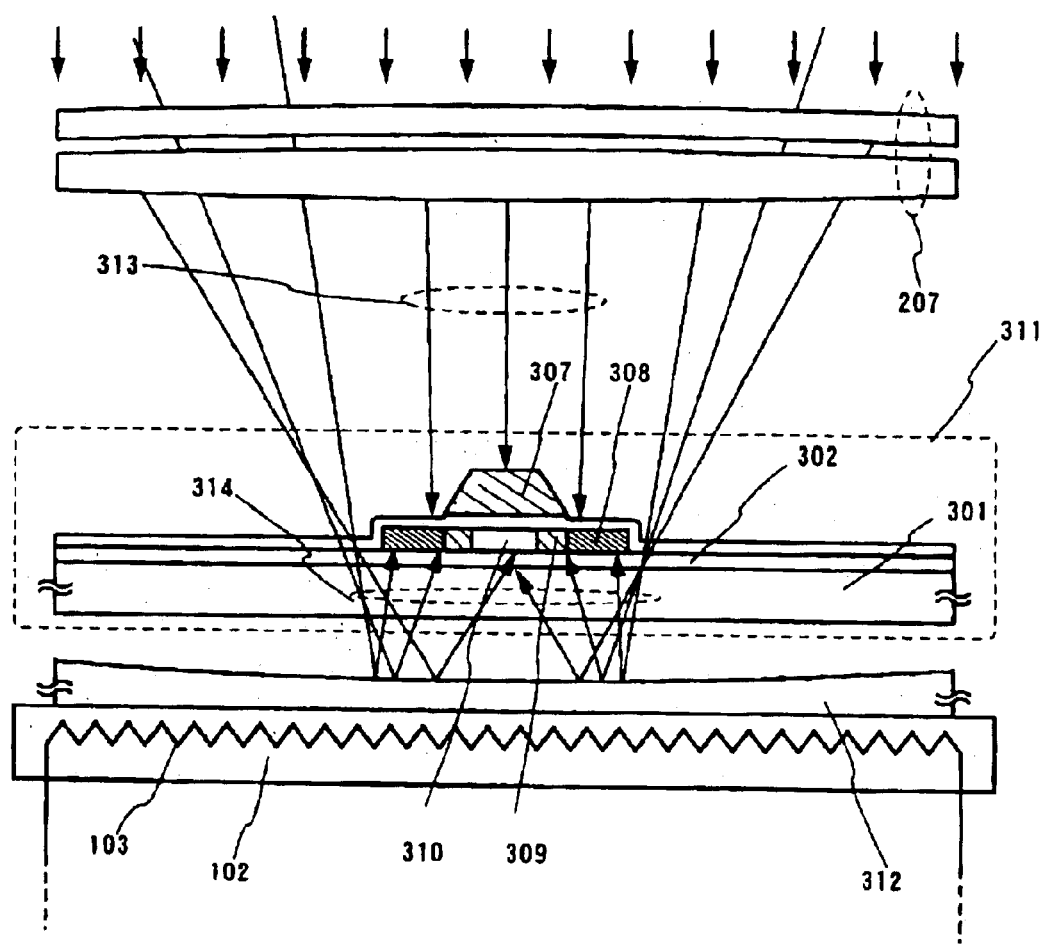
FIG. 24 shows an example of a laser annealing method of the present invention when the reflecting surface of the reflector is made to be a curved surface.

With respect to the laser light transmitted through the cylindrical lens 207, it forms an incidence angle of 45° to 90° relative to the surface of the substrate in a condensing process thereof. Thus, the second laser light 314 can be diffracted to reach the rear surface side of the semiconductor film and irradiated thereon. Also, when rugged portions are formed on the reflecting surface of the reflector 312 to effect diffuse reflection of the laser light, the second laser light 314 can be obtained more efficiently. As shown, for example, in FIG. 24, when the reflecting surface of the reflector 312 is made to be a curved surface (for example, a concave surface), the laser light can be irradiated onto the semiconductor film while being condensed, and thus it is efficient.

As described above, according to the present invention, the laser light from the solid laser as the oscillation source can be linearly processed and the processed linear laser light can be divided into the first laser light and the second laser light to irradiate the laser light onto the rear surface of the semiconductor film. Further, although the source region and the drain region are required to be regions having lower resistance as compared with the LDD regions, since the first laser light and the second laser light are irradiated, the impurity element is sufficiently activated.

Further, since the heater 103 and the heater controller 104 are provided in the stage 102 of the laser irradiation apparatus, it is possible to irradiate the laser light while heating the substrate at 100° C. to 450° C. Thus, the recovery of crystallinity and the activation of the impurity element can be performed more efficiently.

Figure 19:
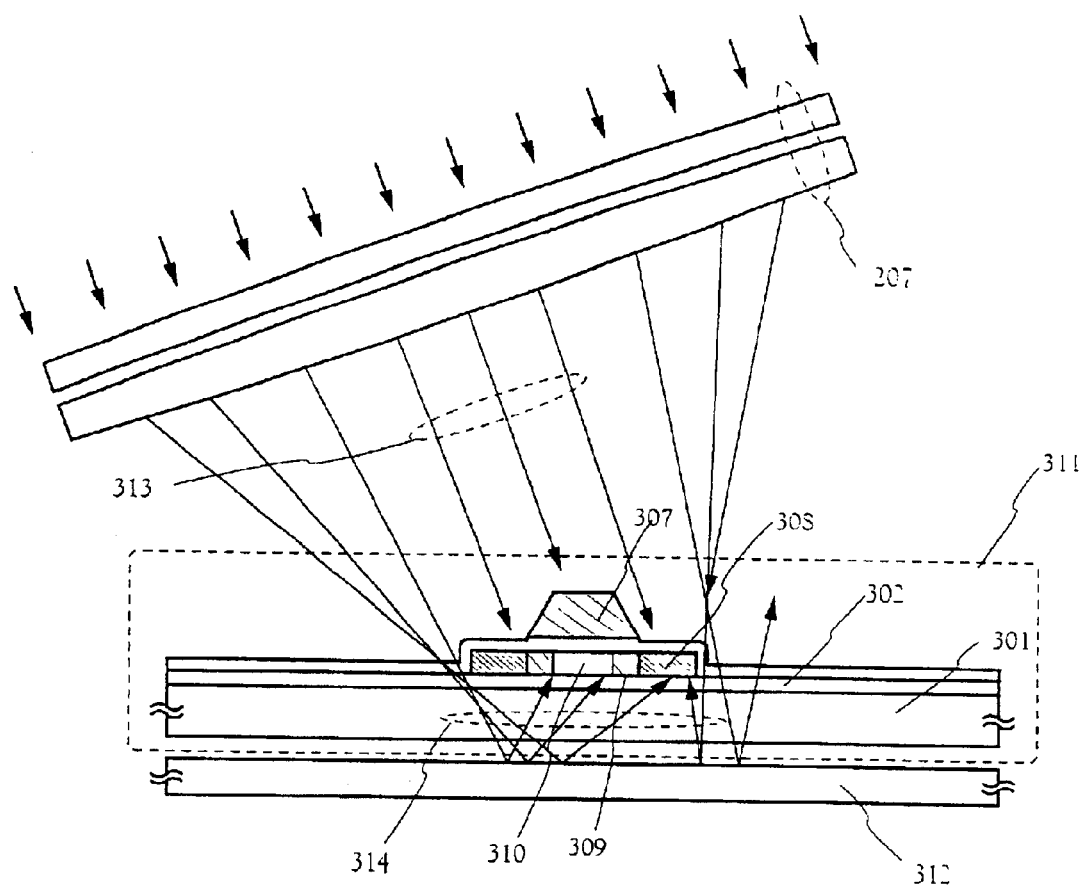
FIG. 19 shows an example of a laser annealing method of the present invention.

Also, as shown in FIG. 19, when the laser light is irradiated to the semiconductor film substrate at a slant angle, the second laser light can be easily irradiated onto the semiconductor film overlapped with the gate electrode, and thus the recovery of crystallinity of the semiconductor film and the activation of the impurity element is sufficiently performed.

The present invention having the above structure will he described in more detail based on embodiments described hereinbelow.

[Embodiment 1]

An embodiment of the present invention will be described. FIG. 1A shows a structure of a laser irradiation apparatus. This laser irradiation apparatus has a laser oscillator 101, an optical system 201 for linearly processing laser light 210 (preferably, the second harmonic) from the laser oscillator 101 as an oscillation source, and a stage 102 for holding a translucent substrate. A heater 103 and a heater controller 104 is provided in the stage 102 and thus the substrate can be heated at 100° C. to 450° C. Also, a reflector 105 is provided on the stage 102 and a substrate 106 on which a semiconductor film is formed is located thereon.

Note that, when the laser light outputted from the laser oscillator 101 is to he modulated to the second harmonic or the third harmonic, a wavelength modulator including a non-linear element may be provided immediately after the laser oscillator 101. In this embodiment, an Nd:YAG laser is used as the laser oscillator 101 and laser light modulated to the second harmonic by the non-linear optical element is used. However, the Nd:YAG laser is a laser having high coherent property. Thus, it is desirable that a thin film polarizer (TFP), a polarizing plate, and the like are provided before the optical system 201 so that an optical path length of a part of the laser light emitted from the laser oscillator 101 may he extended to thereby prevent an interference in an irradiation surface.

Next, a method of holding the substrate 106 in the laser irradiation apparatus having the structure as shown in FIG. 1A will be described using FIG. 1B. The substrate 106 held in the stage 102 is located in a reaction chamber 107 and then linear laser light from the laser oscillator 101 as an oscillation source is irradiated thereto. The inner portion of the reaction chamber can be made to he in a reduced pressure state or in an inert gas atmosphere by an evacuation system or a gas system (both are not shown). Thus, the semiconductor film can be heated at 100° C. to 450° C. without contaminating it.

Also, the stage 102 can be moved along guide rails 108 within the reaction chamber and thus the linear laser light can be irradiated onto the entire surface of the substrate. The laser light is made incident from a window (not shown) made of quartz, which is provided in the top side of the substrate 106. In FIG. 1B, a transfer chamber 109 is connected with the reaction chamber 107, an intermediate chamber 110 is connected with the transfer chamber 109, and a load and unload chamber 111 is connected with the intermediate chamber 110. The reaction chamber 107 and the transfer chamber 109 are isolated from each other by a gate valve 113. The intermediate chamber 110 and the load and unload chamber 111 are isolated from each other by a gate valve 112.

A cassette 114 capable of holding a plurality of substrates is located in the load and unload chamber 111 and the substrate is transferred by a transfer robot 115 provided in the transfer chamber 109. A substrate 106' indicates a substrate which is being transferred. With such a structure, laser annealing processing can be successively performed in a reduced pressure state or in an inert gas atmosphere.

Next, a structure of the optical system 201 for processing laser light into linear light will be described using FIGS. 2A and 2B. FIG. 2A shows the optical system 201 viewed from the side and FIG. 2B shows the optical system 201 viewed from the top.

Laser light from the laser oscillator 101 as an oscillation source is divided in a vertical direction by a cylindrical array lens 202. The divided laser light is further divided in a transverse direction by a cylindrical array lens 203. That is, in the end the laser light is divided in a matrix by the cylindrical array lenses 202 and 203.

Then, the laser light is condensed by a cylindrical lens 204. Then, the laser light passes through a cylindrical lens 205 immediately after the cylindrical lens 204. After that, the laser light is reflected by a mirror 206 and passed through a cylindrical lens 207 to reach an irradiation surface 208.

At this time, the laser light projected onto the irradiation surface 208 indicates a linear irradiation surface. That is, this means that a cross sectional shape of the laser light transmitted through the cylindrical lens 207 becomes linear. Homogenization of the linearly processed laser light in a width direction (short length direction) is made by the cylindrical array lens 202 and the cylindrical lenses 204 and 207. Also, homogenization of the above laser light in a length direction (long length direction) is made by the cylindrical array lens 203 and the cylindrical lens 205.

Next, a structure for irradiating laser light from the rear side of the substrate to the semiconductor film formed on the substrate will be described using FIG. 3. FIG. 3 shows a positional relationship between the substrate 106 and the reflector 105 in FIG. 1A.

In FIG. 3, reference numeral 311 denotes a substrate having a TFT after the gate electrode is formed thereon. Also, a reflector 312 for reflecting laser light is located under the substrate 311.

Here, a method of performing steps until the gate electrode of the TFT is formed will be described using FIGS. 4A to 4C. First, a glass substrate, a synthetic quartz glass substrate, a crystallized glass substrate, or a plastic substrate is used as a translucent substrate 300. In this embodiment, a synthetic quartz glass substrate is used as the translucent substrate 300.

Then, an insulating film containing silicon such as a silicon oxide film or a silicon oxynitride film (SiOxNy), which is formed by a known means (sputtering method, LPCVD method, plasma CVD method, or the like) is preferably used as a base insulating film 301. Of course, the base insulating film may have not only a single layer structure but also a laminate structure. In this embodiment, a silicon oxide film is formed at a film thickness of 150 nm by a plasma CVD method.

Then, a semiconductor film 302 having an amorphous structure is formed at a thickness of 25 to 80 nm (preferably, 30 to 60 nm) by a known means (sputtering method, LPCVD method, plasma CVD method, or the like). A material of the semiconductor film is not limited to a specific material. However, the semiconductor film is preferably made of silicon, a silicon germanium (SiGe) alloy, or the like. In this embodiment, an amorphous silicon film is formed at a film thickness of 50 nm by a plasma CVD method. After that, a metallic element for promoting crystallization is added to the semiconductor film to form a metal containing layer 303. Plasma processing, evaporation, a sputtering method, ion implantation, solution coating, or the like is preferably used as a method of introducing the metallic element into the semiconductor film. In this embodiment, a nickel acetate aqueous solution (5 ppm in weight conversion concentration and 5 ml in volume) is applied onto the surface of the amorphous silicon film by a spin coat method. Then, thermal treatment is performed to crystallize the semiconductor film. Since the heating time and the heating temperature vary depending on the semiconductor film and the metallic element to be added, those are preferably determined as appropriate by an operator. In this embodiment, it is exposed at 550° C. in an nitrogen atmosphere for 4 hours. After the crystallized semiconductor film is patterned to form an island-like semiconductor film 304, an insulating film including silicon such as a silicon oxide film or a silicon oxynitride film (SiOxNy) is formed as an insulating film 305 by a known means (sputtering method, LPCVD method, plasma CVD method, or the like).

Subsequently, a conductive film 306 is formed. A material of the conductive film 306 is not limited to a specific material. However, the conductive film 306 may be made of an element selected from the group consisting of Ta, W, Ti, Mo, Al, Cu, Cr, and Nd, an alloy material including mainly the above element, or a compound material including mainly the above element. A semiconductor film represented by a crystalline silicon film doped with an impurity element such as phosphorus may be used as the conductive film. An AgPdCu alloy may be also used. Of course, the conductive film may have not only a single layer structure but also a laminate structure. In this embodiment, the conductive film 306 made from a W film having a film thickness of 400 nm is formed. The W film is formed by a sputtering method using W as a target. In addition, the W film can be formed by a thermal CVD method using tungsten hexafluoride ($WF_6$).

Subsequently, etching is performed to form a gate electrode 307 in which tapers are formed in end portions. A mask (not shown) made of a resist is formed by a photolithography method and etching processing is performed for forming an electrode and a wiring. In this embodiment, an ICP (inductively coupled plasma) etching method is used for etching processing and $CF_4$, $Cl_2$, and $O_2$ are used as etching gases and a ratio of respective gas flow rates is set to be 25:25:10 (sccm). RF power having 500 W and 13.56 MHz is supplied to a coil type electrode at a pressure of 1 Pa to produce plasma and to thus perform etching. Here, a dry etching apparatus (Model E645-□ICP) using ICP, which is produced by Matsushita Electronic industrial Co., Ltd. is used. Also, RF power having 150 W and 13.56 MHz is supplied to a substrate side (sample stage) to apply a substantially negative self bias voltage. The W film is etched by this etching processing to form end portions of the conductive layer in taper shapes. Note that, in order to perform etching without leaving the residue on the gate insulating film, an etching time is preferably increased by about 10% to 20%. In the above etching processing, when a shape of the mask made of a resist is suitable, the end portions of the conductive layer becomes taper shapes by an effect of the bias voltage applied to the substrate side. An angle of the taper portions becomes 15° to 45°. Reference numeral 304 denotes a gate insulating film. A region which is not covered with the conductive layer 306 is etched at about 20 nm to 50 nm to become a thinner region.

Then, doping is performed for impurity element introduction. According to the doping processing, one kind or plural kinds of elements selected from noble gas elements and an impurity element for providing an n-type or an impurity element for providing a p-type are introduced into the semiconductor film by an ion doping method, an ion implantation method, or the like. Also, one kind or plural kinds of elements selected from noble gas elements, an impurity element for providing an n-type, and an impurity element for providing a p-type may be introduced. In addition, hydrogen may be added. Of course, a step of introducing a noble gas element may be performed separately from a step of introducing an impurity, element for providing an n-type or an impurity element for providing a p-type. By the doping processing, regions 308 into which the impurity element is introduced at a high concentration, regions 309 into which the impurity element is introduced at a low concentration due to the tapers in the end portions of the gate electrode, and a region (channel forming region) 310 into which the impurity element is not introduced are formed. In this embodiment, phosphorus is used as an element belonging to group 15 in the periodic table and argon is used as a noble gas element. With respect to an implantation condition of phosphorus, 5% $PH_3$ diluted with hydrogen is used, an accelerating voltage is set to be 80 keV, and a dose is set to be $1.5 \times 10^{15}/cm^2$. A time required for implantation is about 8 minutes and thus phosphorus can be implanted into the crystalline semiconductor film at an average concentration of $2 \times 10^{20}/cm^3$. On the other hand, argon is implanted at an accelerating voltage of 90 keV and a dose of $2 \times 10^{15}/cm^2$.

Subsequently, thermal treatment is performed for gettering the metallic element. The metallic element is moved from the channel forming region to the regions to which the impurity element is added by the thermal treatment and thus the channel forming region can be produced as a high resistance region. In this embodiment, thermal treatment is performed for gettering in a nitrogen atmosphere at 550° C. for 4 hours.

A method of sufficiently recovering the crystallinity of the region into which the noble gas element is introduced is shown in FIG. 3.

Here, the reflector 312 may be a substrate such that a metallic film is formed on the surface thereof (reflecting surface of laser light) or may be a reflecting plate made of a material having high reflectance. In this case, any metallic material may be used for the metallic film. Typically, a metallic film containing any element selected from the group consisting of aluminum, silver, tungsten, titanium, and tantalum is used.

Also, instead of disposing the reflector 312, the above metallic film can be directly formed on the rear surface (surface opposite to the front surface) of the substrate 300 to reflect laser light therefrom. Note that this structure is allowed on the condition that the metallic film formed on the rear surface is not removed in a manufacturing process of a semiconductor device. In this embodiment, A synthetic quartz glass substrate on which aluminum is formed by sputtering is used as the reflector.

Then, the laser light linearly processed through the optical system 201 (of which only the cylindrical lens 207 is shown in the drawings) described using FIGS. 2A and 2B is also irradiated to the semiconductor film located under the gate electrode 307.

At this time, the laser light irradiated to the semiconductor film includes laser light 313 directly irradiated thereto through the cylindrical lens 207 and laser light 314 irradiated thereto after it is reflected from the reflector 312. Note that in this specification, laser light irradiated onto the surface of the reflector is called first laser light and laser light reflected from the reflector is called second laser light With respect to the laser light transmitted through the cylindrical lens 207, it forms an incidence angle of 45° to 90° relative to the surface of the substrate in a condensing process. Thus, the second laser light 314 is also diffracted to the rear side of the semiconductor film and irradiated thereon. Also, when rugged portions are provided on the reflecting surface of the reflector 312 to effect diffuse reflection of the laser light, the second laser light 314 can be obtained with higher efficiency. When the reflecting surface of the reflector 312 is made to be a concave surface, the laser light can be irradiated to the semiconductor film while condensing it, and thus it is efficient.

As described above, according to this embodiment, the laser light from the solid laser as the oscillation source can be linearly processed and the processed laser light can be divided into the first laser light and the second laser light to irradiate the laser light to the rear surface of the semiconductor film. Further, although the source region and the drain region are required to be lower resistance regions as compared with the LDD regions, since the first laser light and the second laser light are irradiated to the semiconductor film, the recovered of crystallinity and the activation of the impurity element can be sufficiently performed.

Further, since the heater 103 and the heater controller 104 are included in the stage 102 of the laser irradiation apparatus, it is possible to irradiate the laser light while the substrate is heated to about 450° C. and the recovery of crystallinity and the activation of the impurity element can be made with higher efficiency.

[Embodiment 2]

In this embodiment, the case where laser annealing is performed for a semiconductor film substrate obtained through manufacturing steps different from Embodiment 1 will be described.

Figure 7A:
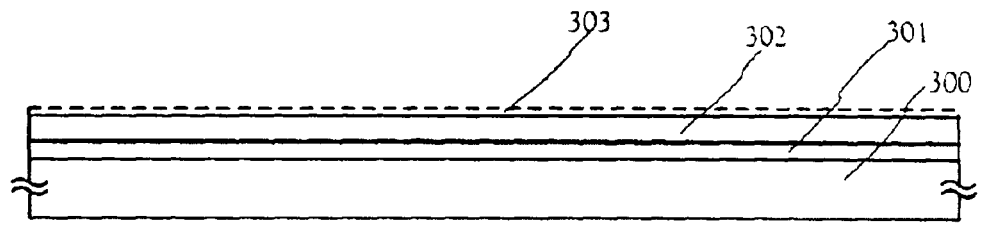
FIGS. 7A to 7D show manufacturing steps of the TFT having the GOLD structure of Embodiment 2.

Here, a method of performing steps until the gate electrode of the TFT is formed will be described using FIGS. 7A to 7D. First, the state shown in FIG. 4A is obtained in accordance with Embodiment 1. Note that a state shown in FIG. 7A is the same state as in FIG. 4A.

Then, first thermal treatment is performed to crystallize a semiconductor film. Since the heating time and the heating temperature are dependent on the semiconductor film and the metallic element to be added, those are preferably determined as appropriate by an operator. In this embodiment, the semiconductor film is exposed at 550° C. in an nitrogen atmosphere for 4 hours.

Successively, a mask 755 is formed and first doping processing is performed to selectively introduce an impurity element into the semiconductor film. According to the doping processing, one kind or plural kinds of elements selected from noble gas elements and an impurity element for providing an n-type or an impurity element for providing a p-type are introduced into the semiconductor film by an ion doping method, an ion implantation method, or the like. One kind or plural kinds of elements selected from noble gas elements, an impurity element for providing an n-type, and an impurity element for providing a p-type may be introduced. In addition, hydrogen may be added. In this embodiment, first, only argon is implanted at an accelerating voltage of 90 keV and a dose of $2 \times 10^{15}/cm^2$ by an ion doping method.

Figure 7B:
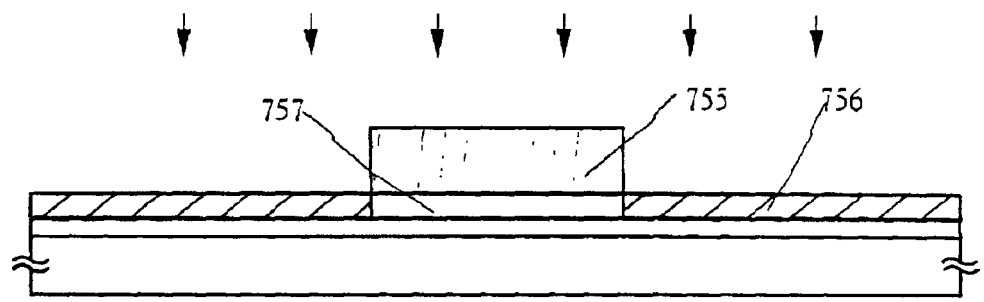

Then, second thermal treatment is performed to move the metallic element used for promoting crystallization to a region 756 into which the impurity element is introduced (gettering). In this embodiment, thermal treatment is performed for gettering in a nitrogen atmosphere at 550° C. for 4 hours. (FIG. 7B)

The region 756 in which the metallic element is gettered is etched and the mask is removed to form a semiconductor layer 757. Then, an insulating film including silicon such as a silicon oxide film or a silicon oxynitride film (SiOxNy) is formed as an insulating film 758 by a known process (sputtering method, LPCVD method, plasma CVD method, or the like).

Figure 7C:
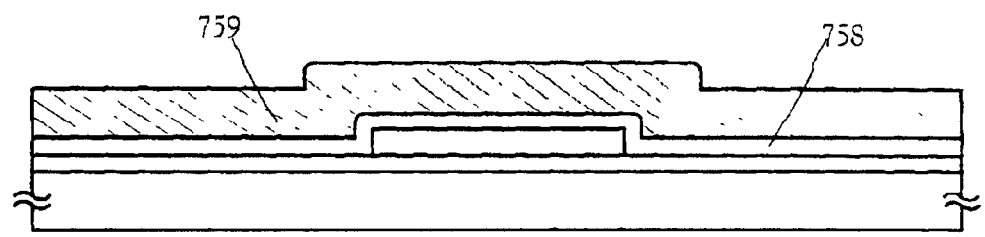

Subsequently, a conductive film 759 is formed. A material of the conductive film is not limited to a specific material. However, the conductive film may be made of an element selected from the group consisting of Ta, W, Ti, Mo, Al, Cu, Cr, and Nd, an alloy material including mainly the above element, or a compound material including mainly the above element. A semiconductor film represented by a crystalline silicon film doped with an impurity element such as phosphorus may be used as the conductive film. An AgPdCu alloy may be also used. Of course, the conductive film may be made from not only a single layer but also a laminate. In this embodiment, the conductive film 759 made from a W film having a film thickness of 400 nm is formed. The W film is formed by a sputtering method using W as a target. (FIG. 7C)

Subsequently, etching is performed to form a gate electrode 760 in which tapers are formed in end portions. A mask (not shown) made of a resist is formed by a photolithography method and etching processing is performed for forming an electrode and a wiring. In the above etching processing, when a shape of the mask made of a resist is suitable, the end portions of the conductive layer becomes taper shapes by an effect of the bias voltage applied to the substrate side. An angle of the taper portions becomes 15° to 45°. Reference numeral 758 denotes a gate insulating film. A region which is not covered with the conductive layer (gate electrode) 760 is etched at about 20 nm to 50 nm to form a thinner region.

Then, doping processing is performed for impurity element introduction. According to the doping processing, an impurity element for providing an n-type or an impurity element for providing a p-type is introduced into the semiconductor film by an ion doping method, an ion implantation method, or the like. By the doping processing, regions 761 into which the impurity element is introduced at a high concentration, regions 762 into which the impurity element is introduced at a low concentration by the tapers in the end portions of the gate electrode, and a region (channel forming region) 763 into which the impurity element is not introduced are formed. In this embodiment, phosphorus is used as an element belonging to the group 15. With respect to an implantation condition of phosphorus, 5% $PH_3$ diluted with hydrogen is used, an accelerating voltage is set to be 80 keV, and a dose is set to be $1.5 \times 10^{15}/cm^2$. A time required for implantation is about 8 minutes, and thus phosphorus can be implanted into the crystalline semiconductor film at an average concentration of $2 \times 10^{20}/cm^3$.

Figure 7D:
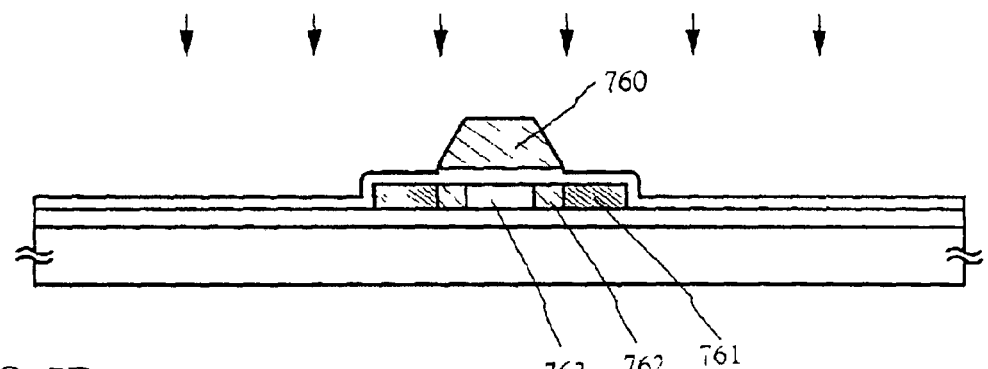

Then, thermal treatment is performed for gettering the above-mentioned metallic element. The metallic element is moved from the channel forming region to the region to which the impurity element is added by the thermal treatment, and thus the channel forming region can be produced as a high resistance region. In this embodiment, thermal treatment is performed for gettering in a nitrogen atmosphere at 550° C. for 4 hours. (FIG. 7D)

Then, the recovery of crystallinity of the region into which the impurity element is introduced and the activation of the impurity element are made by the method shown in FIG. 3, which is described in Embodiment 1.

Here, the reflector 312 may be a substrate such that a metallic film is formed on the surface thereof (reflecting surface of laser light) or may be a reflecting plate made of a material having high reflectance. In this case, any material may be used for the metallic film. Typically, a metallic film including any element selected from the group consisting of aluminum, silver, tungsten, titanium, and tantalum is used.

Further, since the heater 103 and the heater controller 104 are included in the stage 102 of the laser irradiation apparatus, it is possible to irradiate the laser light while heating the substrate to about 450° C. and thus the recovery of crystallinity and the activation of the impurity element can be performed with higher efficiency.

[Embodiment 3]

In this embodiment, the case where laser annealing is performed for a semiconductor film substrate obtained through manufacturing steps different from Embodiment 1 and Embodiment 2 will be described.

Here, a method of performing steps up to formation of the gate electrode of the TFT will be described using FIGS. 20A–20D. First, the state shown in FIG. 4A, in which a semiconductor film 302 is formed, is obtained in accordance with Embodiment 1. Note that the same reference numerals are used in FIG. 20A for the parts corresponding to those in FIG. 4A.

An insulating film including silicon such as a silicon oxide film or a silicon oxynitride film (SiOxNy) is formed as an insulating film 770 having an opening by a known process (sputtering method, LPCVD method, plasma CVD method, or the like). Then, a metallic element for promoting crystallization is added to form a metallic containing layer 771. Plasma processing, evaporation, a sputtering method, ion implantation, solution coating, or the like is preferably used as a method of introducing the above-mentioned metallic element into the semiconductor film. First thermal treatment is performed to crystallize the semiconductor film. Since the heating time and the heating temperature are dependent on the semiconductor film and the metallic element to be added, those are preferably determined as appropriate by an operator. In this embodiment, it is exposed at 550° C. in an nitrogen atmosphere for 4 hours.

Subsequently, first doping processing is performed to selectively introduce an impurity element into the semiconductor film. According to the doping processing, one kind or plural kinds of elements selected from noble gas elements is introduced into the semiconductor film by an ion doping method, an ion implantation method, or the like. Also, one kind or plural kinds of elements selected from noble gas elements and an impurity element for providing an n-type or an impurity element for providing a p-type may be introduced. One kind or plural kinds of elements selected from noble gas elements, an impurity element for providing an n-type, and an impurity element for providing a p-type may be introduced. In addition, hydrogen may be added. In this embodiment, first, only argon is implanted at an accelerating voltage of 90 keV and a dose of $2\times10^{15}/cm^2$ by an ion doping method.

Figure 20A:
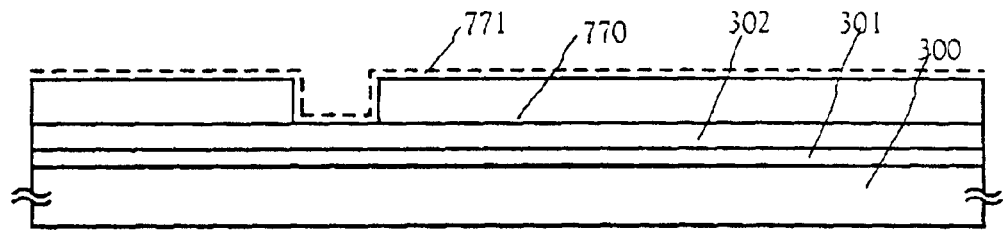
FIGS. 20A to 20D show manufacturing steps of the TFT having the GOLD structure of Embodiment 3.
Figure 20B:
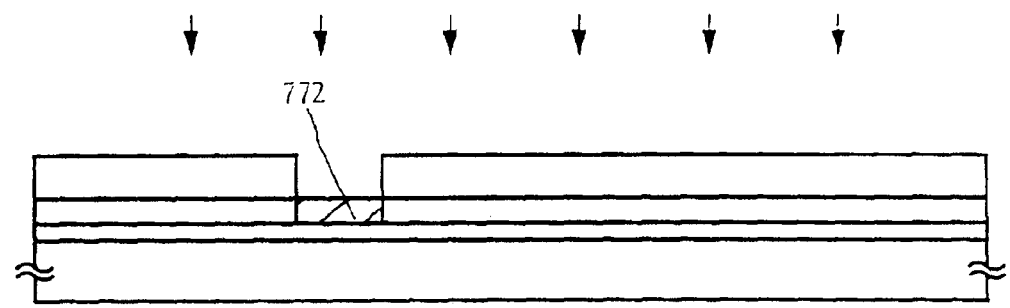

Then, second thermal treatment is performed to move the metallic element used for promoting crystallization to a region 772 into which the impurity element is introduced (gettering). In this embodiment, thermal treatment is performed for gettering in a nitrogen atmosphere at 550° C. for 4 hours. (FIG. 20B)

The insulating film 770 and apart of the semiconductor film are etched to form a semiconductor layer 773. Then, an insulating film including silicon such as a silicon oxide film or a silicon oxynitride film (SiOxNy) is formed as an insulating film 774a by a known process (sputtering method, LPCVD method, plasma CVD method, or the like).

Figure 20C:
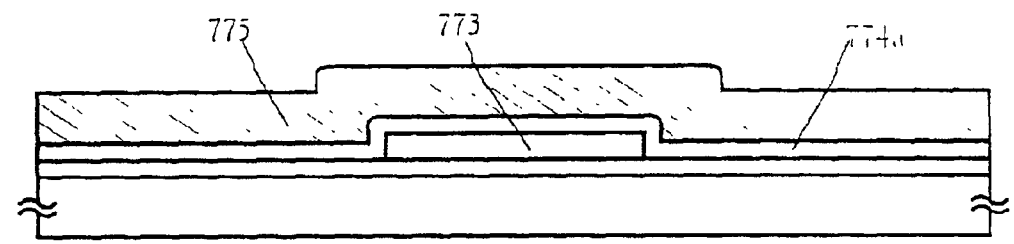

Subsequently, a conductive film 775 is formed. A material of the conductive film is not limited to a specific material. However, the conductive film may be made of an element selected from the group consisting of Ta, W, Ti, Mo, Al, Cu, Cr, and Nd, an alloy material including mainly the above-mentioned element, or a compound material including mainly the above-mentioned element. A semiconductor film represented by a crystalline silicon film doped with an impurity element such as phosphorus may be used as the conductive film. An AgPdCu alloy may be also used. Of course, the conductive film may be made from not only a single layer but also a laminate. In this embodiment, the conductive film 775 made from a W film having a film thickness of 400 nm is formed. (FIG. 20C)

Subsequently, etching is performed to form a gate electrode 776 in which tapers are formed in its end portions. A mask (not shown) made of a resist is formed by a photolithography method and etching processing is performed for forming an electrode and a wiring. In the above etching processing, when a shape of the mask made of a resist is suitable, the end portions of the conductive layer becomes taper shapes by an effect of the bias voltage applied to the substrate side. An angle of the taper portions becomes 15° to 45° Reference numeral 774b denotes a gate insulating film. A region which is not covered with the gate electrode 776 is etched at about 20 nm to 50 nm to form a thinner region.

Figure 20D:
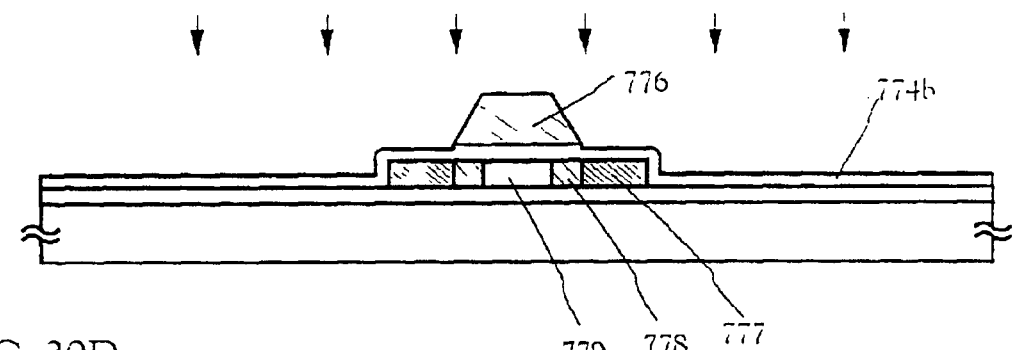

Then, second doping processing is performed for impurity element introduction. According to the doping processing, an impurity element for providing an n-type or an impurity element for providing a p-type is introduced into the semiconductor film by an ion doping method, an ion implantation method, or the like. By the doping processing, regions 777 into which the impurity element is introduced at a high concentration, regions 778 into which the impurity element is introduced at a low concentration by the tapers in the end portions of the gate electrode, and a region (channel forming region) 779 into which the impurity element is not introduced are formed. In this embodiment, phosphorus is used as an impurity element for providing an n-type. With respect to an implantation condition of phosphorus, 5% $PH_3$ diluted with hydrogen is used, an accelerating voltage is set to be 80 keV, and a dose is set to be $1.5\times10^{15}/cm^2$. A time required for implantation is about 8 minutes, and thus phosphorus can be implanted into the crystalline semiconductor film at an average concentration of $2\times10^{20}/cm^3$. (FIG. 20D)

Then, the recovery of crystallinity of the region into which the impurity element is introduced and the activation of the impurity element are performed by the method shown in FIG. 3, which is described in Embodiment 1.

Here, the reflector 312 may be a substrate such that a metallic film is formed on the surface thereof (reflecting surface of laser light) or may be a reflecting plate made of a material having high reflectance. In this case, any material may be used for the metallic film. Typically, a metallic film including any element selected from the group consisting of aluminum, silver, tungsten, titanium, and tantalum is used.

Further, since the heater 103 and the heater controller 104 are included in the stage 102 of the laser irradiation apparatus, it is possible to irradiate the laser light while heating the substrate to 100 to 450° C. and the recovery of crystallinity and the activation of the impurity element can be performed with higher efficiency.

[Embodiment 4]

In this embodiment, the case where laser annealing is performed to a semiconductor film substrate obtained through manufacturing steps different from Embodiment 1 to Embodiment 3 will be described.

First, a method of performing steps up to formation of the gate electrode of a TFT will be described using FIGS. 23A to 23D. A glass substrate, a synthetic quartz glass substrate, a crystallized glass substrate, or a plastic substrate is used as a translucent substrate 300. In this embodiment, a synthetic quartz glass substrate is used as the translucent substrate 300.

A conductive film 780 having a desired shape is formed by forming a conductive film and performing etching. A material of the conductive film is not limited to a specific material. However, the conductive film may be made of an element selected from the group consisting of Ta, W, Ti, Mo, Al, Cu, Cr, and Nd, an alloy material including mainly the above-mentioned element, or a compound material including mainly the above-mentioned element. A semiconductor film represented by a crystalline silicon film doped with an impurity element such as phosphorus may be used as the conductive film. An AgPdCu alloy may be also used. Of course, the conductive film may have not only a single layer structure but also a laminate structure. In this embodiment, the conductive film 780 made from a W film having a film thickness of 400 nm is formed. The W film is formed by a sputtering method using W as a target. In addition, a thermal CVD method using tungsten fluoride ($WF_6$) can also form the W film.

Then, an insulating film containing silicon such as a silicon oxide film or a silicon oxynitride film (SiOxNy), which is formed by a known means (sputtering method, LPCVD method, plasma CVD method, or the like) is preferably used as an insulating film 781. Of course, the insulating film may have not only single layer structure but also a laminate structure. In this embodiment, a silicon oxide film having a film thickness of 150 nm is formed by a plasma CVD method.

Figure 23A:
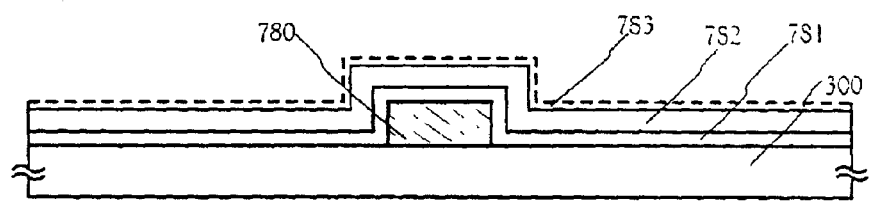
FIGS. 23A to 23D show manufacturing steps of a TFT and an example of laser annealing of Embodiment 4.
Figure 23B:
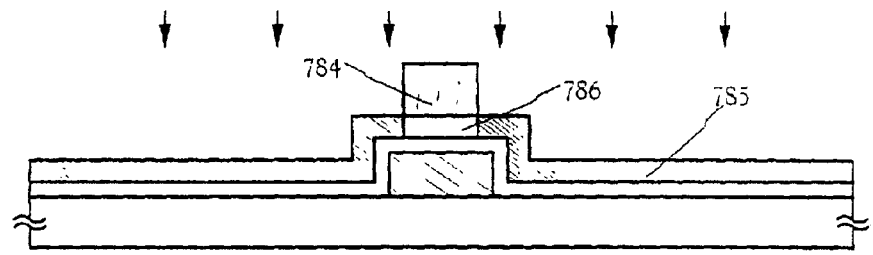

Subsequently, a semiconductor film 782 having an amorphous structure is formed at a thickness of 25 to 80 nm (preferably, 30 to 60 nm) by a known process (sputtering method, LPCVD method, plasma CVD method, or the like). A material of the semiconductor film is not limited to a specific material. However, the semiconductor film is preferably made of silicon, a silicon germanium (SiGe) alloy, or the like. In this embodiment, an amorphous silicon film is formed at a film thickness of 50 nm by a plasma CVD method. Then, a known crystallization method is performed to crystallize the semiconductor film. In this embodiment, a nickel acetate aqueous solution (5 ppm in weight conversion concentration and 5 ml in volume) is applied onto the surface of the amorphous silicon film by a spin coat method to form a metallic containing layer 783. After that, it is exposed at 550° C. in an nitrogen atmosphere for 4 hours. Since the heating time and the heating temperature vary depending on the kind of the semiconductor film and the metallic element to be added, those are preferably determined as appropriate by an operator. (FIG. 23A)

Subsequently, a mask 784 is formed and doping is performed to selectively introduce an impurity element into the semiconductor film. According to the doping processing, one kind or plural kinds of elements selected from noble gas elements and an impurity element for providing an n-type or an impurity element for providing a p-type are introduced into the semiconductor film by an ion dope method, an ion implantation method, or the like. Also, one kind or plural kinds of elements selected from noble gas elements, an impurity element for providing an n-type, and an impurity element for providing a p-type may be introduced. In addition, hydrogen may be further added. In this embodiment, phosphorus is used as an impurity element for providing an n-type and argon is used as a noble gas element. With respect to an implantation condition of phosphorus, 5% $PH_3$ diluted with hydrogen is used, an accelerating voltage is set to be 80 keV, and a dose is set to be $1.5 \times 10^{15}/cm^2$. A time required for implantation is about 8 minutes and phosphorus can be implanted into the crystalline semiconductor film at an average concentration of $2 \times 10^{20}/cm^3$. On the other hand, argon is implanted at an accelerating voltage of 90 keV and a dose of $2 \times 10^{15}/cm^2$.

When the metallic element is used for crystallizing the semiconductor film as in this embodiment, it is desirable that the thermal treatment is performed for gettering the metallic element. The metallic element is moved from the channel forming region 786 to the regions 785 to which the impurity element is added by the thermal treatment and thus the channel forming region 786 can be produced as a high resistance region. In this embodiment, thermal treatment is performed for gettering in a nitrogen atmosphere at 550° C. for 4 hours.

Figure 23C:
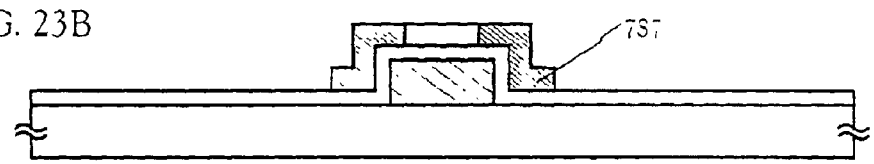
Figure 23D:
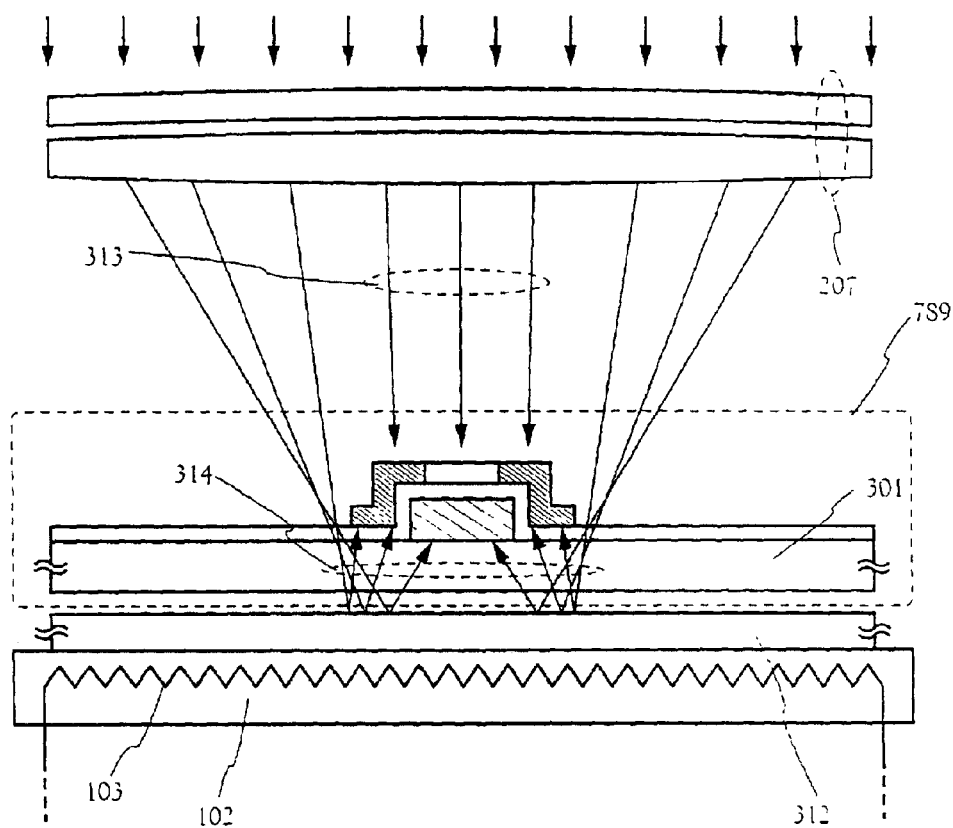

The mask 784 is removed and the semiconductor layer as the active region 787 is formed (FIG. 23C). After that, in order to sufficiently recover crystallinity of the region into which the noble gas element is introduced, laser annealing is performed as in Embodiments 1 to 3 (FIG. 23D).

Here, the reflector 312 may be a substrate such that a metallic film is formed on the surface thereof (reflecting surface of laser light) or may be a reflecting plate made of a material having high reflectance. In this case, any metallic material may be used for the metallic film. Typically, a metallic film including any element selected from the group consisting of aluminum, silver, tungsten, titanium, and tantalum is used.

Then, the laser light linearly processed through the optical system 201 (in the drawings, only the cylindrical lens 207 is shown) described using FIGS. 2A and 2B is irradiated from not only the front side but also the rear side to the semiconductor film. When such an irradiation method is applied, since the conductive layer 780 has high thermal conductivity, heat generated by laser annealing can be easily diffused. Thus, when laser light is irradiated from not only the front side of the substrate but also the rear side thereof, the laser annealing can be effectively performed.

Further, since the heater 103 and the heater controller 104 are included in the stage 102 of the laser irradiation apparatus, it is possible to irradiate the laser light while heating the substrate to about 450° C. and the recovery of crystallinity and the activation of the impurity element can be performed with higher efficiency.

[Embodiment 5]

In this embodiment, a method of manufacturing an active matrix substrate will be described using FIGS. 8A to 8C, 9A to 9C, 10A to 10C, 11 and 12.

First, in this embodiment, a substrate 320 made of glass such as barium borosilicate glass (represented by #7059 glass, #1737 glass, or the like, which is produced by Corning Corporation) or aluminoborosilicate glass is used. Note that a quartz substrate, a flexible substrate, or the like can be used as the substrate 320. The flexible substrate is a film substrate made of PET, PES, PEN, acrylic, or the like. When a semiconductor device is manufactured using the flexible substrate, weight reduction can be expected. It is preferred that a barrier layer such as an aluminum film (AlON, AlN, AlO, or the like), a carbon film (DLC (diamond-like carbon) or the like), or an SiN film is formed as a single layer or a multilayer on the surface of the flexible substrate or on both surfaces thereof to improve the durability and the like. Also, a plastic substrate having a heat resistance to a processing temperature in this embodiment may be used.

Next, a base film 321 made from an insulating film such as a silicon oxide film, a silicon nitride film, or a silicon oxynitride film is formed on the substrate 320. In this embodiment, a two-layer structure is used for the base film 321. However, a single layer film of the insulating film or a structure in which two layers or more are laminated may be used. As a first layer of the base film 321, a silicon oxynitride film 321a is formed at 10 nm to 200 nm (preferably, 50 nm to 100 nm) by a plasma CVD method using $SiH_4$, $NH_3$, and $N_2O$ as reactive gases. In this embodiment, the silicon oxynitride film 321a (composition ratio:Si=32%, O=27%, N=24%, and H=17%) having a film thickness of 50 nm is formed. As a second layer of the base film 321 a silicon oxynitride film 321b is laminated thereon at a thickness of 50 nm to 200 nm (preferably, 100 nm to 150 nm) by a plasma CVD method using $SiH_4$, and $N_2O$ as reactive gases. In this embodiment, the silicon oxynitride film 321b (composition ratio:Si=32%, O=59%, N=7%, and H=2%) having a film thickness of 100 nm is formed.

Figures 8A, 8B, 8C:
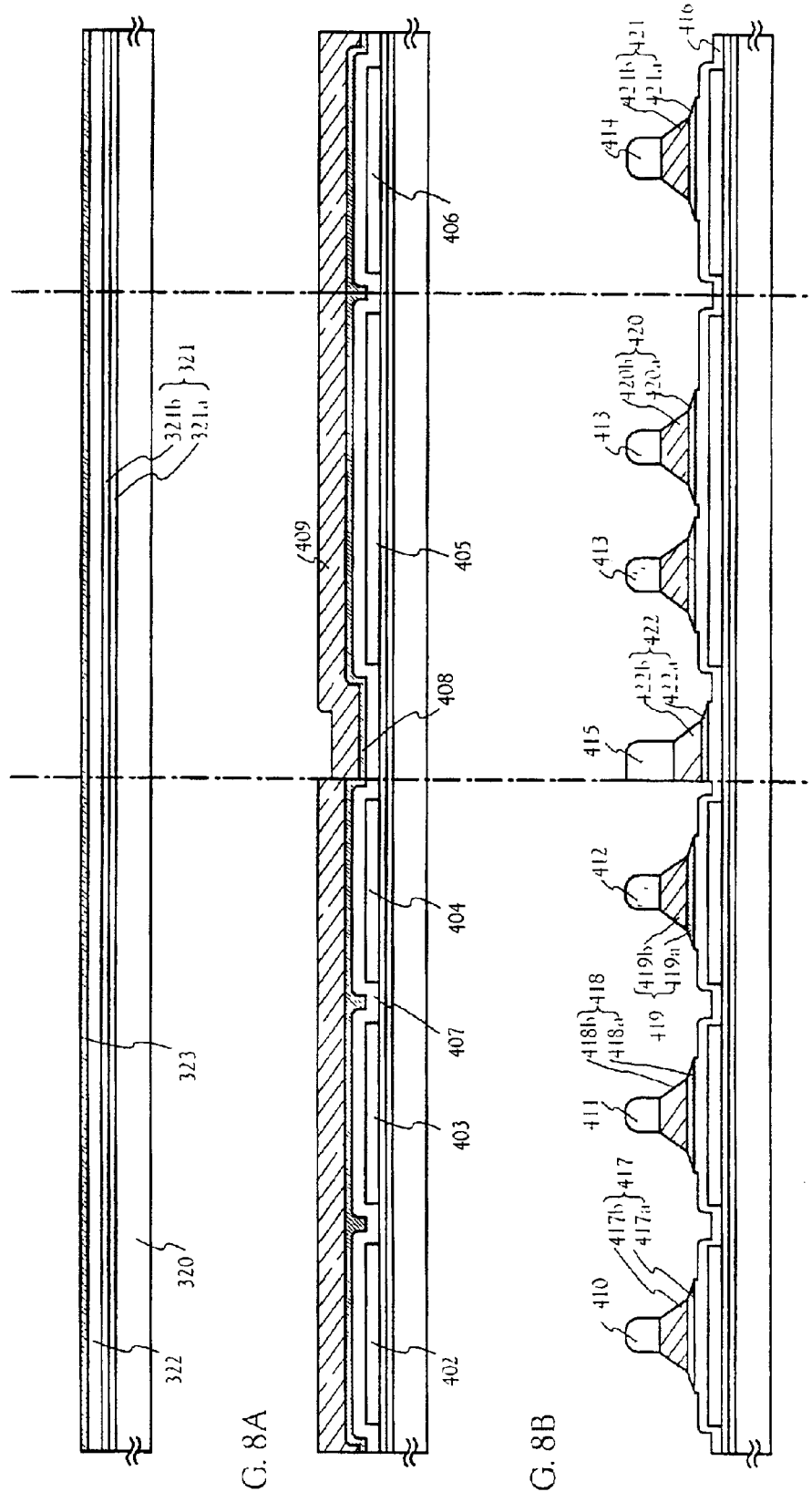
FIGS. 8A to 8C are cross sectional views indicating an example of manufacturing steps of pixel TFTs and TFTs of a driver circuit of Embodiment 5.

Then, a semiconductor film 322 is formed on the base film. The semiconductor film 322 is obtained by forming a semiconductor film having an amorphous structure at a thickness of 25 nm to 200 nm, preferably, 25 nm to 80 nm (typically, 30 nm to 60 nm) by a known process (sputtering method, LPCVD method, plasma CVD method, or the like). A material of the semiconductor film is not limited to a specific material. However, the semiconductor film is preferably made of silicon, a silicon germanium (SiGe) alloy, or the like. Subsequently, a thermal crystallization method using a catalyst such as nickel is performed through forming a metal containing layer 323. Of course, other known crystallization processing (laser crystallization method, thermal crystallization method, or the like) may be combined with the thermal crystallization method using a catalyst such as nickel (FIG. 8A). A crystalline semiconductor film obtained by such a method is patterned in a predetermined shape to form semiconductor layers 402 to 406. In this embodiment, after an amorphous silicon film having a thickness of 55 nm is formed by a plasma CVD method, a solution containing nickel is held on the amorphous silicon film. The amorphous silicon film is dehydrogenated at 500° C. for 1 hour and then thermal treatment is performed at 550° C. for 4 hours to form a crystalline silicon film. Then, the crystalline silicon film is patterned by using a photolithography method to form the semiconductor layers 402 to 406.

When a laser crystallization method is also applied to the crystallization of the semiconductor film, a solid laser, a gas laser, a metallic laser or the like, which is a pulse oscillation type or a continuous light emitting (continuous wave) type, can be used. Note that there are exemplified a YAG laser, a $YVO_4$ laser, a YLF laser, a $YAlO_3$ laser, a glass laser, a ruby laser, an alexandrite laser, a Ti: sapphire laser, and the like, which perform continuous oscillation or pulse oscillation, as the solid laser. Also, there are exemplified an excimer laser, an Ar laser, a Kr laser, a $CO_2$ laser, and the like, which perform continuous oscillation or pulse oscillation, as the gas laser. Further, there are exemplified a helium cadmium laser, a copper vapor laser, and a gold vapor laser as the metallic laser. When these lasers are used, a method of linearly condensing a laser beam emitted form a laser oscillator by an optical system and irradiating it to the semiconductor film is preferably used. A crystallization condition is selected as appropriate by an operator. When an excimer laser is used, a pulse oscillation frequency is set to be 300 Hz and a laser energy density is set to be 100 $mJ/cm^2$ to 1200 $mJ/cm^2$, preferably 100 $mJ/cm^2$ to 800 $mJ/cm^2$ (typically, 200 $mJ/cm^2$ to 700 $mJ/cm^2$). When a YAG laser is used, it is desirable that the second harmonic is used, a pulse oscillation frequency is set to be 1 Hz to 300 Hz and a laser energy density is set to be 300 $mJ/cm^2$ to 1500 $mj/cm^2$, preferably, 300 $mJ/cm^2$ to 1000 $mJ/cm^2$ (typically, 350 $mJ/cm^2$ to 800 $mJ/cm^2$). A laser beam linearly condensed at a width of 100 $\mu m$ to 1000 $\mu m$, for example, 400 $\mu m$ is irradiated onto the entire surface of the substrate. At this time, an overlap ratio of the linear laser beam may be set to be 50% to 98%. When a continuous oscillation laser is used, an energy density of about 0.01 $MW/cm^2$ to 100 $MW/cm^2$ (preferably, 0.1 $MW/cm^2$ to 10 $MW/cm^2$) is required. A stage is moved relatively to laser light at a speed of about 0.5 cm/s to 2000 cm/s and laser light is irradiated thereto to form the crystalline silicon film.

After the formation of the semiconductor layers 402 to 406, a trace impurity element (boron or phosphorus) may be doped for controlling a threshold value of a TFT.

Then, a gate insulating film 407 covering the semiconductor layers 402 to 406 is formed. An insulating film containing silicon is formed as the gate insulating film 407 at a thickness of 40 nm to 150 nm by a plasma CVD method or a sputtering method. In this embodiment, a silicon oxynitride film (composition ratio:Si=32%, O=59%, N=7%, and H=2%) is formed at a thickness of 110 nm by a plasma CVD method. Of course, the gate insulating film is not limited to the silicon oxynitride film and another insulating film containing silicon may be used as a single layer or a laminate structure.

Also, when a silicon oxide film is used, TEOS (tetraethyl orthosilicate) and $O_2$. are mixed by a plasma CVD method, a reactive pressure is set to be 40 Pa, and a substrate temperature is set to be 300° C. to 400° C. Then, discharge is caused at a high frequency (13.56 MHz) power density of 0.5 $W/CM^2$ to 0.8 $W/cm^2$ and thus the silicon oxide film can be formed. After that, when thermal anneal is performed for the thus formed silicon oxide film at 400° C. to 500° C., a preferable characteristic as to the gate insulating film can be obtained.

Then, as shown in FIG. 8B, a first conductive film 408 having a film thickness of 20 nm to 100 nm and a second conductive film 409 having a film thickness of 100 nm to 400 nm are laminated on the gate insulating film 407. In this embodiment, the first conductive film 408 made from a TaN film having a film thickness of 30 nm and the second conductive film 409 made of a W film having a film thickness of 370 nm are laminated. The TaN film is formed by a sputtering method using Ta as a target in an atmosphere containing nitrogen. Also, the W film is formed by a sputtering method using W as a target. In addition, it can he formed by a thermal CVD method using tungsten hexafluoride ($WF_6$). In any case, when these films are used for a gate electrode, it is necessary to reduce the resistance and resistivity of the W film is desirably made to be 20 μΩcm or lower. When a crystal grain is enlarged, the resistivity of the W film can be reduced. However, if a large number of impurity elements such as oxygen are present in the W film, crystallization is hindered and the resistance is increased. Therefore, in this embodiment, the W film is formed by a sputtering method using high purity W (purity of 99.9999%) as a target after due consideration such that an impurity is not entered from a gas phase at film formation. Thus the resistivity of 9 μΩ cm to 20 μΩ cm can be realized.

Note that, in this embodiment, TaN is used for the first conductive film 408 and W is used for the second conductive film 409. However, the material are not particularly limited to these and respective conductive films may be made of an element selected from the group consisting of Ta, W, Ti, Mo, Al, Cu, Cr, and Nd, an alloy material containing mainly the above element, or a compound material containing mainly the above element. A semiconductor film represented by a crystalline silicon film doped with an impurity element such as phosphorus may be also used. An AgPdCu alloy may be also used. There may be also used a combination in which the first conductive film is made from a tantalum (Ta) film and the second conductive film is made from a W film, a combination in which the first conductive film is made from a titanium nitride (TiN) film and the second conductive film is made from a W film, a combination in which the first conductive film is made from a tantalum nitride (TaN) film and the second conductive film is made from an Al film, and a combination in which the first conductive film is made from a tantalum nitride (TaN) film and the second conductive film is made from a Cu film.

Then, masks 410 to 415 made of resists are formed by a photolithography method and first etching processing is performed for forming an electrode and a wiring. The first etching processing is performed under a first etching condition and a second etching condition. In this embodiment, with respect to the first etching condition, an ICP (inductively coupled plasma) etching method is used, $CF_4$, $Cl_2$, and $O_2$ are used as etching gases, and a ratio of respective gas flow rates is set to be 25:25:10 (sccm). RF power having 500 W and 13.56 MHz is supplied to a coil type electrode at a pressure of 1 Pa to produce plasma and to thus perform etching. Here, a dry etching apparatus (Model E645-□ICP) using ICP, which is produced by Matsushita Electronic industrial Co., Ltd. is used. Also, RF power having 150 W and 13.56 MHz is supplied to a substrate side (sample stage) to apply a substantially negative self bias voltage. The W film is etched under the first etching condition to form end portions of the first conductive layer in taper shapes.

After that, the first etching condition is changed to the second etching condition without removing the masks 410 to 415 made of resists. $CF_4$ and $Cl_2$, are used as etching gases and a ratio of respective gas flow rates is set to be 30:30 (sccm). RF power having 500 W and 13.56 MHz is supplied to a coil type electrode at a pressure of 1 Pa to produce plasma and to thus perform etching for about 30 seconds. Also, RF power having 20 W and 13.56 MHz is supplied to a substrate side (sample stage) to apply a substantially negative self bias voltage. In the second etching condition such as $CF_4$ and $Cl_2$ are mixed, both the W film and the TaN film are etched to the same degree. Note that, in order to perform etching without leaving the residue on the gate insulating film, an etching time is preferably increased at a rate by about 10% to 20%.

In the first etching processing, when shapes of the masks made of resists are suitable, the end portions of the first and second conductive layers become taper shapes by an effect of the bias voltage applied to the substrate side. An angle of the taper portions becomes 15° to 45°. Thus, first shaped conductive layers 417 to 422 made from the first conductive layers and the second conductive layers (first conductive layers 417a to 422a and second conductive layers 417b to 422b) are formed by the first etching processing. Reference numeral 416 denotes a gate insulating film. Regions which are not covered with the first shaped conductive layers 417 to 422 are etched by about 20 nm to 50 nm to form thinner regions. (FIG. 8D)

Figure 9A:
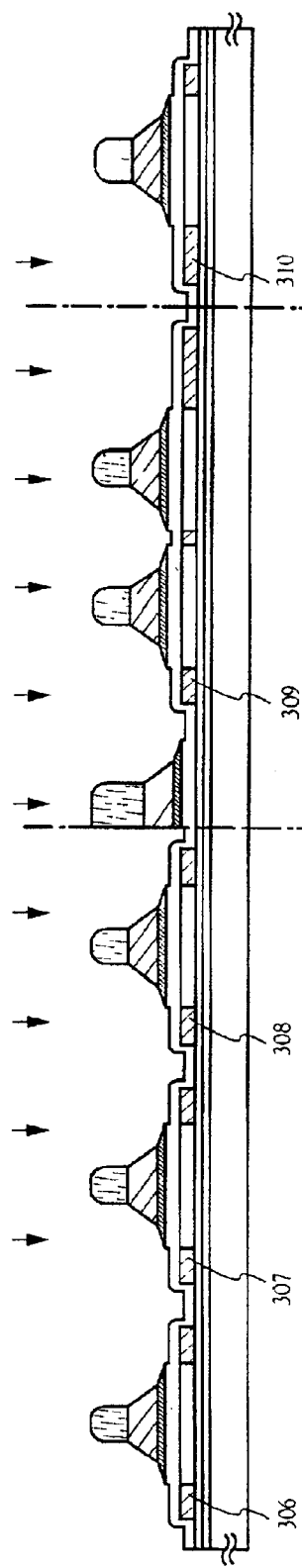
FIGS. 9A to 9C are cross sectional views indicating an example of manufacturing steps of the pixel TFTs and the TFTs of the driver circuit of Embodiment 5.

Then, first doping processing is performed without removing the masks made of resists to add an impurity element for providing an n-type and a noble gas element for gettering the metallic element used for promoting crystallization to the semiconductor layers (FIG. 9A). The doping processing is preferably performed by an ion dope method or an ion implantation method. With respect to a condition of the ion dope method, a dose is set to be $1\times10^{13}/cm^2$ to $5\times10^{15}/cm^2$ and an accelerating voltage is set to be 60 keV to 100 keV. In this embodiment, a dose is set to be $1.5\times10^{15}/cm^2$ and an accelerating voltage is set to be 80 keV. An element belonging to group 15 in the periodic table, typically, phosphorus (P) or arsenic (As) is used as the impurity element for providing an n-type. Here, phosphorus (P) is used. Also, argon is used as the noble gas element. In this case, the conductive layers 417 to 421 become masks to the impurity element for providing an n-type and thus first high concentration impurity regions 306 to 310 are formed in a self alignment. The impurity element for providing an n-type is added to the first high concentration impurity regions 306 to 310 at a concentration range of $1\times10^{20}/cm^3$ to $1\times10^{21}/cm^3$. On the other hand, argon is implanted at an accelerating voltage of 90 keV and a dose of $2\times10^{15}/cm^2$.

Then, second etching processing is performed without removing the masks made of resists. Here, $SF_4$, $Cl_2$, and $O_2$ are used as etching gases and the W film is selectively etched. At this time, second conductive layers 428b to 433b are formed by the second etching processing. On the other hand, the first conductive layers 417a to 422a are not almost etched (428a-433a) to form second shaped conductive layers 428 to 433.

Figure 9B:
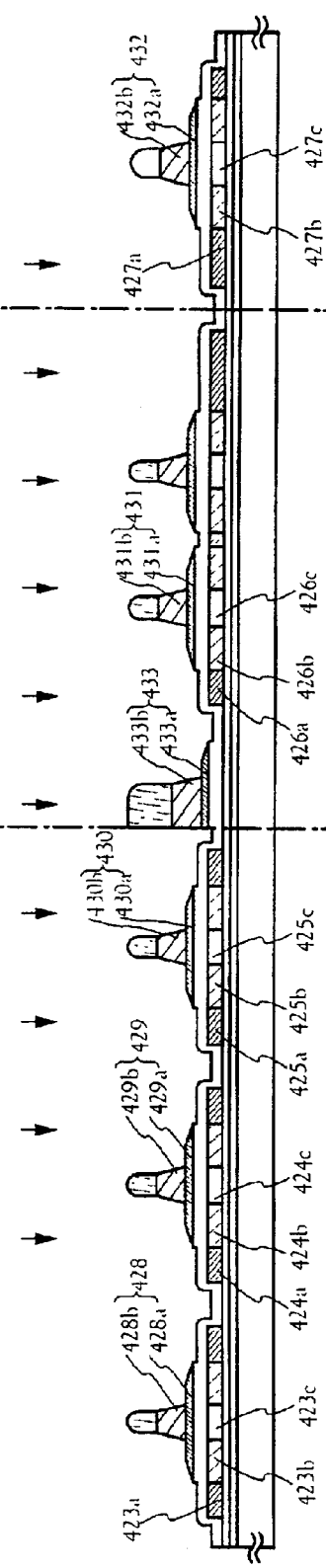

Then, as shown in FIG. 9B, second doping processing is performed without removing the masks made of resists. In this case, a dose is decreased as compared with the first doping processing and the impurity element for providing an n-type is introduced at a high accelerating voltage of 70 keV to 120 keV. In this embodiment, a dose is set to be $1.5\times10^{14}/cm^2$ and an accelerating voltage is set to be 90 keV. According to the second doping processing, the second shaped conductive layers 428 to 433 are used as masks and the impurity element is also introduced into the semiconductor film located under the second conductive layers 428b to 433b to form second high concentration impurity regions 423a to 427a and low concentration impurity regions 423b to 427b.

Figure 9C:
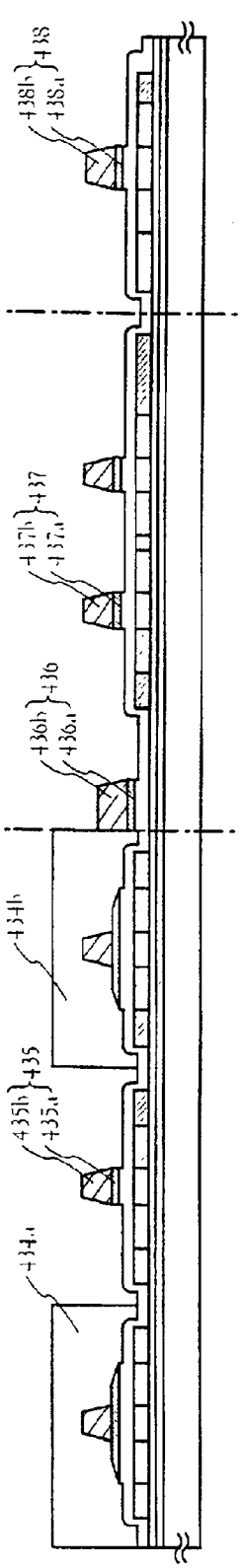

Then, after the masks made of resists are removed, masks 434a and 434b made of resists are newly formed and third etching processing is performed as shown in FIG. 9C. $SF_6$ and $Cl_2$ are used as etching gases and a ratio of respective gas flow rates is set to be 50:10 (sccm). RF power having 500 W and 13.56 MHz is supplied to a coil type electrode at a pressure of 1.3 Pa to produce plasma and to thus perform etching for about 30 seconds. Also, RF power having 10 W and 13.56 MHz is supplied to a substrate side (sample stage) to apply a substantially negative self bias voltage. Thus, the TaN films for a p-channel TFT and a TFT (pixel TFT) of a pixel portion are etched by the third etching processing to form third shaped conductive layers 435 to 438 (435a-438a and 435b-438b)

Then, after the masks made of resists are removed, the second shaped conductive layers 428 and 430 and the second shaped conductive layers 435 to 438 are used as masks and the gate insulating film 416 is selectively removed to form insulating films 439 to 444 (FIG. 10A).

Then, new masks 445a to 445c made of resists are newly formed and third doping processing is performed. By this third doping processing, impurity regions 446a to 446c and 447a to 447c to which an impurity element for providing a conductively type reverse to the above conductivity type is added are formed in the semiconductor layer as an active layer of a p-channel TFT. The second conductive layers 435a to 438a are used as masks to the impurity element and the impurity element for providing a p-type is added to form the impurity regions in a self alignment. In this embodiment, the impurity regions 446a to 446c and 447a to 447c are formed by an ion dope method using diborane ($B_2H_6$) (FIG. 10B). At the third doping processing, the semiconductor layer composing an n-channel TFT is covered with the masks 445a to 445c made of resists. Phosphorus is added to the impurity regions 446a to 446c and 447a to 447c at different concentrations by the first doping processing and the second doping processing However, doping is performed such that a concentration of the impurity element for providing a p-type in any region becomes $2 \times 10^{20}/cm^3$ to $2 \times 10^{21}/cm^3$. Thus, since those impurity regions function as the source region and the drain region of the p-channel TFT, no problem is caused. In this embodiment, since a portion of the semiconductor layer as the active layer of the p-channel TFT is exposed, there is an advantage such that the impurity element (boron) can be easily added.

The impurity regions are formed in the respective semiconductor layers by the above steps.

Then, the masks 445a to 445c made of resists are removed and a first interlayer insulating film 461 is formed. An insulating film containing silicon is formed as the first interlayer insulating film 461 at a thickness of 100 nm to 200 nm by a plasma CVD method or a sputtering method. In this embodiment, a silicon oxynitride film is formed at a film thickness of 150 nm by a plasma CVD method. Of course, the first interlayer insulating film 461 is not limited to the silicon oxynitride film and another insulating film including silicon may be used as a single layer or a laminate structure.

Then, as shown in FIG. 10C, thermal treatment is performed for the recovery of crystallinity of the semiconductor layers and the activation of the impurity element added to the respective semiconductor layers. This thermal treatment is performed by a thermal anneal method using a furnace-annealing furnace. The thermal anneal method may be performed at an oxygen concentration of 1 ppm or less, preferably, 0.1 ppm or less in a nitrogen atmosphere at 400° C. to 700° C., typically, 500° C. to 550° C. In this embodiment, the thermal treatment at 550° C. for 4 hours is performed for the activation processing. Note that, a laser annealing method or a rapid thermal annealing method (RTA method) other than the thermal annealing method can be applied.

Note that, in this embodiment, the impurity regions 423a, 425a, 426a, 446a, and 447a including high concentration phosphorus are crystallized by nickel used as a catalyst at crystallization, simultaneous to the above activation processing. Therefore, the metallic element is gettered into the impurity regions and a nickel concentration in the semiconductor layers mainly serving as the channel forming regions is reduced. With respect to the TFT having the thus formed channel forming region, an off current value is reduced and a high field effect mobility is obtained because of high crystallinity. Thus, a preferable characteristic can be achieved.

Thermal treatment may be performed before the formation of the first interlayer insulating film. Note that, when the wiring material used is vulnerable to heat, it is preferable that thermal treatment is performed after the interlayer insulating film (insulating film including mainly silicon, for example, silicon nitride film) for protecting a wiring and the like is formed as in this embodiment.

In order to perform satisfactory recovery of crystallinity of the regions into which the noble gas element is introduced and the activation of the impurity element, laser light irradiated from the front side of the substrate is reflected by a reflector 340 provided in the rear side of the substrate. Thus, the laser light is irradiated from the rear side of the substrate (FIG. 10C). In this embodiment, an aluminum plate is used as the reflector 340 for irradiating laser light to the substrate at a slant angle. Simultaneously, when a heater or the like is used and thermal treatment is also performed from the rear side of the substrate, hydrogenation processing using hydrogen included in the first interlayer insulating film can be performed.

When a trace impurity element (boron or phosphorus) is doped for controlling a threshold of a TFT, the crystallinity of the channel forming region is sufficiently recovered by the laser light irradiation from the rear side.

When thermal treatment is not simultaneously performed in a laser annealing step, it is desirable that thermal treatment is performed in an atmosphere including 3% to 100% of hydrogen at 300° C. to 550° C. for 1 hour to 12 hours to hydrogenate the semiconductor layers. In this embodiment, thermal treatment is performed in a nitrogen atmosphere including about 3% of hydrogen at 410° C. for 1 hour. This step is a step of terminating dangling bonds of the semiconductor layers by hydrogen included in the interlayer insulating film. Plasma hydrogenation (using hydrogen excited by plasma) may be performed as another hydrogenation means.

Then, a second interlayer insulating film 462 made of an inorganic insulating film material or an organic insulator material is formed on the first interlayer insulating film 461. In this embodiment, an acrylic resin film having a film thickness of 1.6 μm is formed. A material having a viscosity of 10 cp to 1000 cp, preferably, 40 cp to 200 cp, such that an uneven surface is produced is used therefor.

In this embodiment, in order to prevent mirror reflection, an uneven portion is formed on the surface of a pixel electrode by forming the second interlayer insulating film 462 such that an uneven surface is produced. In order to form the uneven portion on the surface of the pixel electrode and thus to attain light scattering property, a convex portion may be formed in a region under the pixel electrode. In this case, since the convex portion can he formed using the same photo mask as in the formation of the TFT, it can be formed without increasing the number of steps. Note that the convex portion may be provided appropriately on the substrate in a pixel portion region except for wirings and TFTs. Thus, the uneven portion is formed on the surface of the pixel electrode along the uneven portion produced on the surface of the insulating film covering the convex portion.

A film having a flattened surface may be used as the second interlayer insulating film 462. In this case, it is desirable that the uneven portion is produced on the surface by adding a step for a known sandblast method, etching method, or the like after the pixel electrode is formed, and thus mirror reflection is prevented and whiteness is increased by scattering reflected light.

Then, wirings 463 to 467 electrically connected with the respective impurity regions are formed in a driver circuit 506. Note that those wirings are formed by patterning a laminate film composed of a Ti film having a film thickness of 50 nm and an alloy film (alloy film of Al and Ti) having a film thickness of 500 nm.

Figure 11:
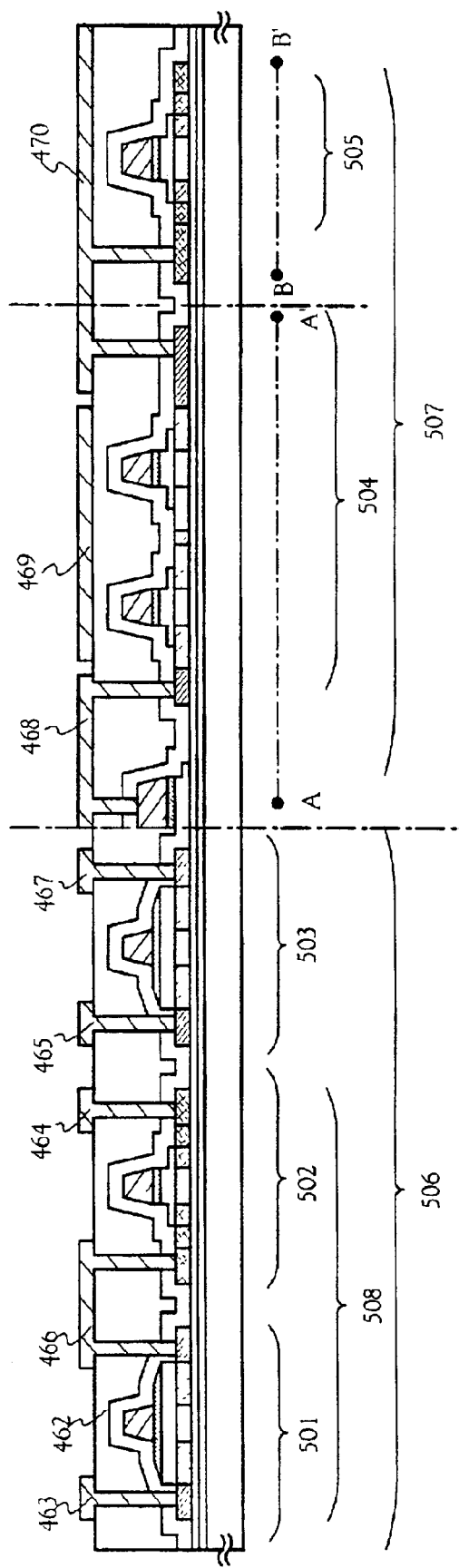
FIG. 11 is a cross sectional view indicating an example of manufacturing steps of the pixel TFTs and the TFTs of the driver circuit of Embodiment 5.

Also, a pixel electrode 470, a gate wiring 469, and a connection electrode 468 are formed in a pixel portion 507 (FIG. 11). A source wiring 436 (laminate of layer 436a and layer 436b is electrically connected with the pixel TFT through the connection electrode 468. The gate wiring 469 is electrically connected with the gate electrode of the pixel TFT. The pixel electrode 470 is electrically connected with a drain region 426a of the pixel TFT and further with a semiconductor layers 447a and 447b which serve as one electrode composing a storage capacitor 505. It is desirable that a material having high reflectance such as a film including mainly Al or Ag or a laminate film thereof is used for the pixel electrode 470.

Thus, the driver circuit 506 having a CMOS circuit 509 composed of an n-channel TFT 501 and a p-channel TFT 502 and an n-channel TFT 503 and the pixel portion 507 having a pixel TFT 504 and a storage capacitor 505 can be formed on the same substrate. Therefore, the active matrix substrate is completed.

The n-channel TFT 501 in the driver circuit 506 includes a channel forming region 423c, low concentration impurity regions 423b (GOLD regions) overlapped with a first conductive layer 428a composing a portion of the gate electrode, and high concentration impurity regions 423a which each serve as the source region or the drain region. The p-channel TFT 502 which is connected with the n-channel TFT 501 through an electrode 466 and composes the CMOS circuit includes a channel forming region 446d, impurity regions 446b and 446c formed outside the gate electrode, and high concentration impurity regions 446a which each serve as the source region or the drain region. Also, the n-channel TFT 503 includes a channel forming region 425c, low concentration impurity regions 425b (GOLD regions) overlapped with a first conductive layer 430a composing a portion of the gate electrode, and high concentration impurity regions 425a which each serve as the source region or the drain region.

The pixel TFT 504 in the pixel portion includes a channel forming region 426c, low concentration impurity regions 426b (LDD regions) formed outside the gate electrode, and high concentration impurity regions 426a which each serve as the source region or the drain region. Impurity elements for providing a p-type are added to respective semiconductor layers 447a and 447b which serve as one electrode of the storage capacitor 505. The storage capacitor 505 is composed of an electrode (laminate of the layer 438a and the layer 438b), and semiconductor layers 447a to 447c using the insulating film 444 as dielectric.

Also, according to a pixel structure of this embodiment, in order to light-shield a gap between pixel electrodes without using a black matrix, the pixel electrode is formed and located such that end portions thereof are overlapped with the source wiring.

Figure 12:
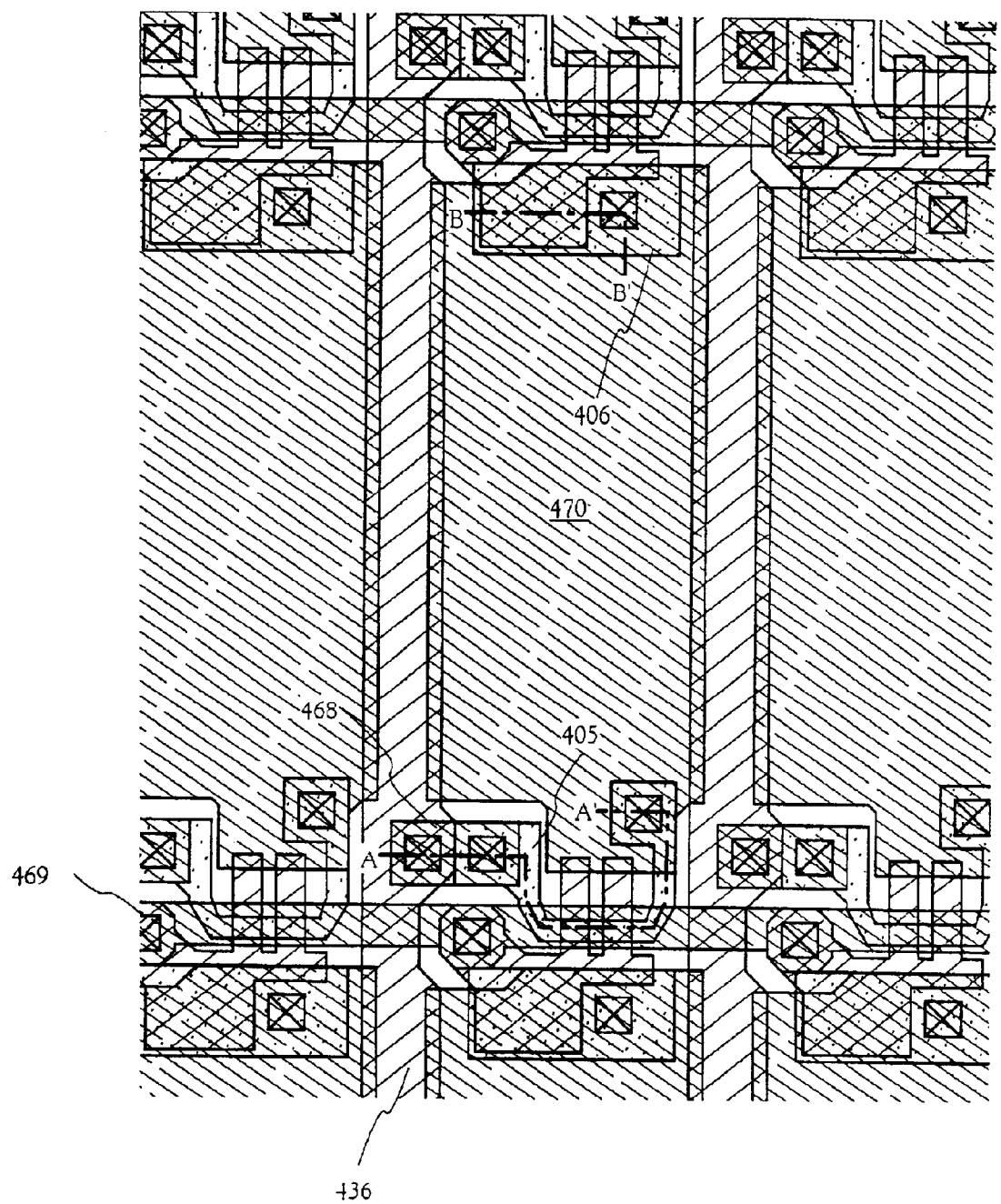
FIG. 12 is a top view of a pixel in a pixel portion of Embodiment 5.

FIG. 12 is a top view of a pixel portion on the active matrix substrate manufactured in this embodiment. Note that the same reference numerals are used for portions corresponding to those of FIGS. 8A to FIG. 11. The dashed line A–A' in FIG. 11 corresponds to a cross sectional view obtained by cutting along the dashed line A–A' of FIG. 12. Also, the dashed line B–B' in FIG. 11 corresponds to a cross sectional view obtained by cutting along the dashed line B–B' of FIG. 12.

[Embodiment 6]

Figure 13:
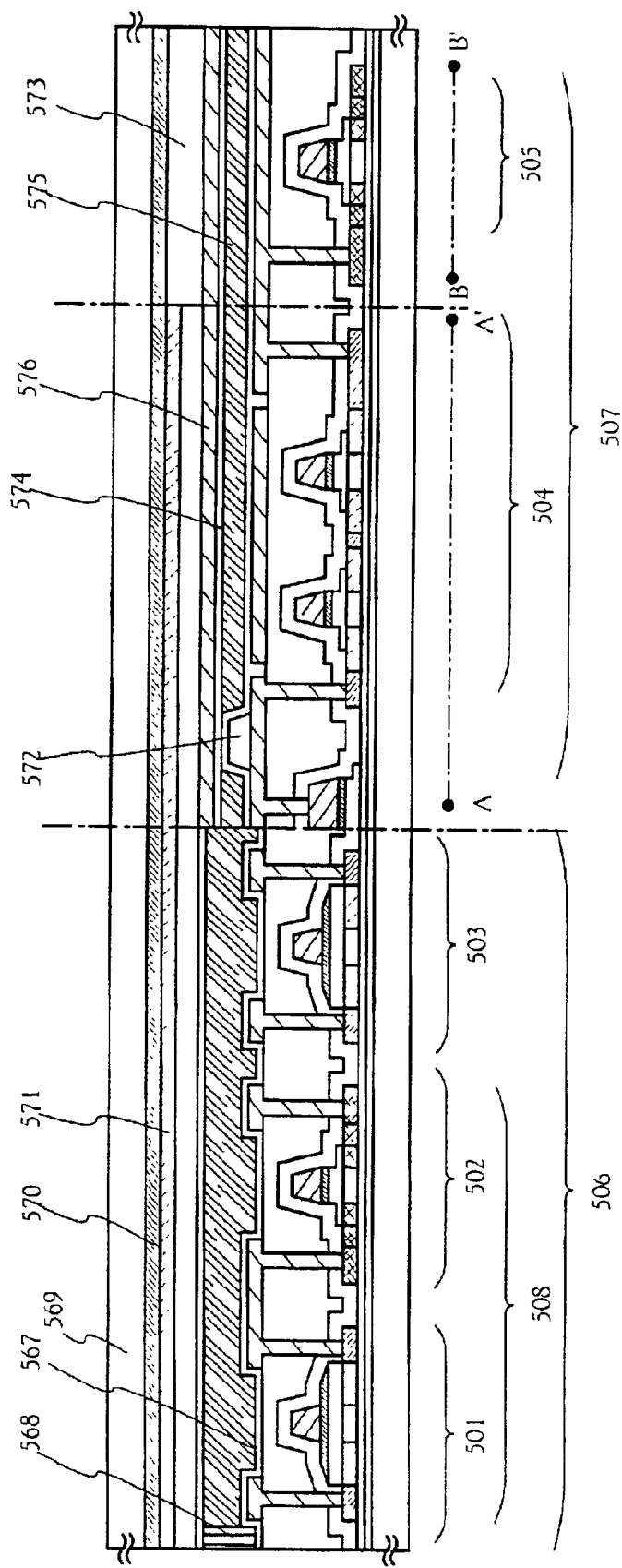
FIG. 13 is a cross sectional view indicating manufacturing steps of an active matrix liquid crystal display device of Embodiment 6.

In this embodiment, an explanation will be given as follows of steps of fabricating a reflection type liquid crystal display apparatus from the active matrix substrate fabricated in Embodiment 5. FIG. 13 is used in the explanation.

First, in accordance with Embodiment 5, there is provided the active matrix substrate in the state of FIG. 11 and thereafter, an alignment film 567 is formed above the active matrix substrate of FIG. 11, at least above the pixel electrode 470 and a rubbing processing is carried out. Further, in this example, before forming the alignment film 567, by patterning an organic resin film such as an acrylic resin film, spacers in a columnar shape 572 are formed at desired positions in order to maintain an interval between substrates. Further, in place of the spacers in the columnar shape, spacers in a spherical shape may be scattered over an entire face of the substrate.

Next, an opposed substrate 569 is prepared. Successively, there are formed color layers 570 and 571 and a flattening film 573. A light shielding portion is formed by overlapping the color layer 570 of red color and the color layer 571 of blue color. Further, the light shielding portion may be formed by overlapping portions of a color layer of red color and a color layer of green color.

In this embodiment, there is used the substrate shown in Embodiment 5. Therefore, in FIG. 12 showing the top view of the pixel portion of Embodiment 5, it is necessary to shield at least a gap between the gate wiring 469 and the pixel electrode 470, a gap between the gate wiring 469 and the connection electrode 468 and a gap between the connection electrode 468 and the pixel electrode 470. In this embodiment, the respective color layers are arranged such that the light shielding portions constituted by laminating the color layers overlap positions to be shielded and the opposed substrate is pasted thereto.

A number of steps can be reduced by shielding the gaps among the respective pixels by the light shielding portions constituted by laminating the color layers in this way without forming light shielding layers such as black masks.

Next, the opposed electrode 576 constituted by a transparent conductive film is formed on the flattening film 573 at least at the pixel portion, an alignment film 574 is formed over an entire face of the opposed substrate and the rubbing processing is carried out.

Further, the active matrix substrate formed with the pixel portion and the driver circuit and the opposed substrate are pasted together by a seal member 568. The seal member 568 is mixed with filler and two of the substrates are pasted together at a uniform interval therebetween by the filler and the spacers in the columnar shape. Thereafter, the interval between the two substrates is injected with a liquid crystal material 575 and is completely sealed by a seal agent (not illustrated). A publicly-known liquid crystal material may be used for the liquid crystal material 575. In this way, the reflection type liquid crystal display apparatus shown in FIG. 13 is finished. Further, as necessary, the active matrix substrate or the opposed substrate may be divided into a desired shape. Further, a polarizer (not illustrated) is pasted to only the opposed substrate. Further, FPC is pasted thereto by using publicly-known technology.

The liquid crystal display panel fabricated in this way can be used as display portions of various electronic apparatus.

This embodiment can be freely combined with the structure in Embodiments 1 to 5.

[Embodiment 7]

In this embodiment, a process for manufacturing an active matrix liquid crystal display device different from that shown in Embodiment 6 using the active matrix substrate manufactured in Embodiment 5 will be described. The description is made with reference to FIG. 21.

First, after the active matrix substrate with the state of FIG. 11 is obtained according to Embodiment 5, an orientation film (alignment film) 1067 is formed on the active matrix substrate of FIG. 11 to perform a rubbing process. Note that, in this embodiment, before the formation of the orientation film 1067, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 1068 is prepared. A color filter in which a colored layer 1074 and a light shielding layer 1075 are arranged corresponding to each pixel is provided in this opposing substrate 1068. Also, a light shielding layer 1077 is provided in a portion of a driver circuit. A leveling film 1076 for covering this color filter and the light shielding layer 1077 is provided. Next, a counter electrode 1069 made of a transparent conductive film is formed in a pixel portion on the leveling film 1076, and then an orientation film 1070 is formed on the entire surface of the opposing substrate 1068 to perform a rubbing process.

Figure 21:
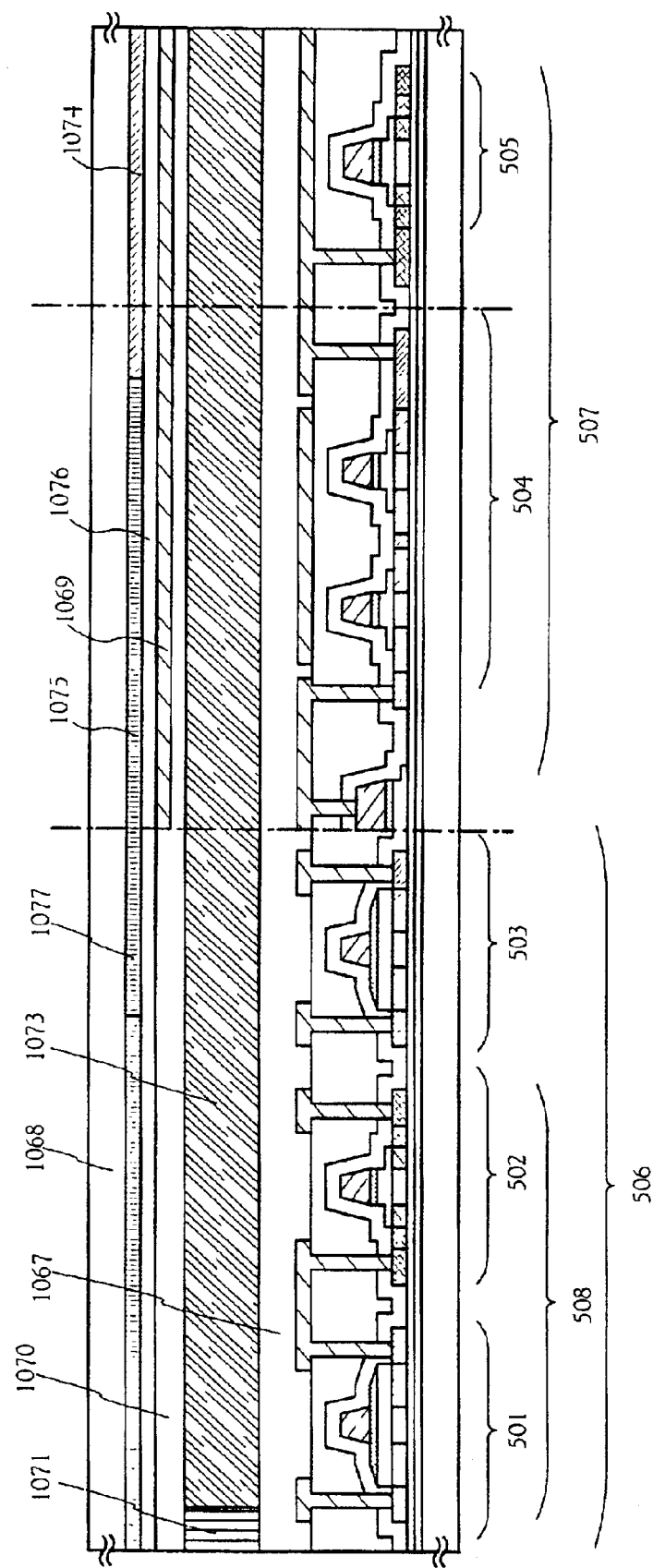
FIG. 21 is a cross sectional view indicating manufacturing steps of an active matrix liquid crystal display device of Embodiment 7.

Then, the active matrix substrate in which the pixel portion and the driver circuit are formed and the opposing substrate are adhered to each other by using a sealing member 1071. Filler is mixed with the sealing member 1071, and two substrates are adhered to each other with a uniform interval by this filler and the columnar spacer. After that, a liquid crystal material 1073 is injected into a space between both substrates and then completely encapsulated by a sealing member (not shown). A known liquid crystal material may be used as the liquid crystal material 1073. Thus, the active matrix liquid crystal display device as shown in FIG. 21 is completed. If necessary, the active matrix substrate or the opposing substrate is cut with a predetermined shape. Also, a polarization plate and the like are suitably provided using a known technique. And, an FPC is adhered to the active matrix liquid crystal display device using a known technique.

A structure of a liquid crystal display panel thus obtained can be used as display portions of various electronic apparatus.

This embodiment can be freely combined with the structure in Embodiments 1 to 5.

[Embodiment 8]

In this embodiment, an example in which a light emitting device is manufactured according to the present invention will be described. In this specification, the light emitting device is a generic name for a display panel in which a light emitting element formed over a substrate is sealed between the substrate and a cover member and a display module in which an IC is mounted on the display panel. Note that the light emitting element has a layer (light emitting layer) including an organic compound such that electro luminescence (EL) produced by applying an electric field thereto is obtained, an anode layer, and a cathode layer. As the electro luminescence in the organic compound, there are light emission (fluorescence) produced when it is returned from a singlet excitation state to a ground state and light emission (phosphorescence) produced when it is returned from a triplet excitation state to a ground state. The electro luminescence includes either light emission or both tight emissions.

Figure 14:
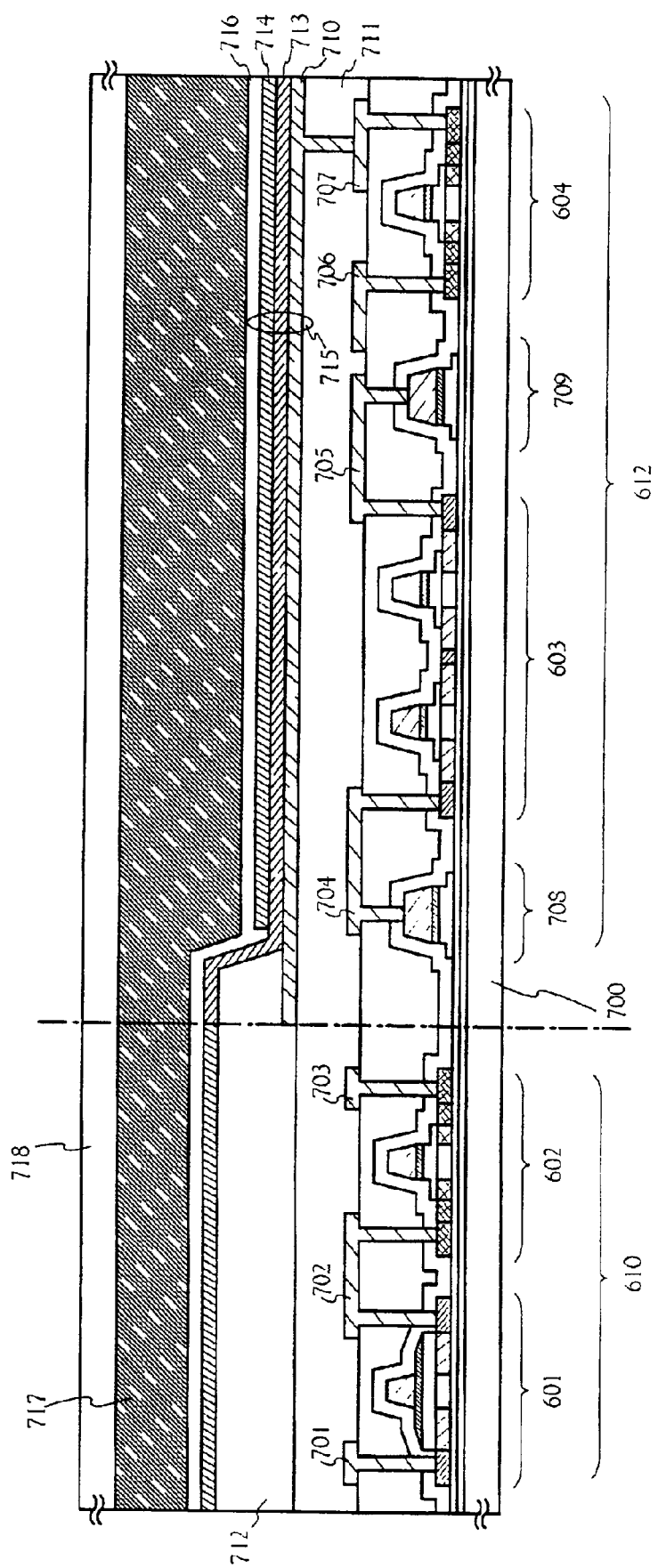
FIG. 14 is a cross sectional structural view of a driver circuit and a pixel portion in a light emitting device of Embodiment 8.

FIG. 14 is a cross sectional view of a light emitting device of this embodiment. In FIG. 14, a switching TFT 603 provided in a pixel portion 612 on a substrate 700 is made from the n-channel TFT 504. Thus, its structure will he described with reference to the description of the n-channel TFT 504.

Note that, in this embodiment, a double gate structure in which two channel forming regions are formed is used. However, a single gate structure in which one channel forming region is formed or a triple gate structure in which three channel forming regions are formed may be used.

A driver circuit 610 provided on the substrate 700 is made from the CMOS circuit shown in FIG. 14. Thus, its structure will be described with reference to the descriptions of the n-channel TFT 501 and the p-channel TFT 502. Note that a single gate structure is used in this embodiment. However, a double gate structure or a triple gate structure may be used.

Wirings 701 and 703 serve as source wirings of the CMOS circuit and a wiring 702 serves as a drain wiring. Also, a wiring 704 serves as a wiring for electrically connecting a source wiring 708 with the source region of the switching TFT and a wiring 705 serves as a wiring for electrically connecting a drain wiring 709 with the drain region of the switching TFT.

Note that a current control TFT 604 is made from the p-channel TFT 502. Thus, its structure will be described with reference to the description of the p-channel TFT 502. Note that a single gate structure is used in this embodiment. However, a double gate structure or a triple gate structure may be used.

A wiring 706 is a source wiring (corresponding to a current supply line) of the current control TFT 604. Reference numeral 707 denotes an electrode electrically connected with a pixel electrode 710 by overlapping it on the pixel electrode 710 of the current control TFT 604.

Note that reference numeral 710 denotes the pixel electrode (anode of a light emitting element) made from a transparent conductive film. A compound of indium oxide and tin oxide, a compound of indium oxide and zinc oxide, zinc oxide, tin oxide, or indium oxide can be used for the transparent conductive film. Also, the transparent conductive film to which gallium is added may be used. The pixel electrode 710 is formed on a flat interlayer insulating film 711 before the above wirings are formed. In this embodiment, it is very important to remove a step due to the TFT using a planarizing film 711 made of a resin and thus to planarize the surface. Since a light emitting layer formed later is very thin, there is the case where light emission failure is caused by the step. Thus, it is desirable that the surface is flattened before the formation of the pixel electrode so that the light emitting layer may have its surface flattened as much as possible.

After the formations of the wirings 701 to 707, a bank 712 is formed as shown in FIG. 14. The bank 712 may be formed by patterning an insulating film including silicon or an organic resin film, having a thickness of 100 nm to 400 nm.

Note that since the bank 712 is an insulating film, the attention to an electrostatic discharge damage of an element in film formation is required. In this embodiment, a carbon particle or a metallic particle is added into the insulating film as a material for the bank 712 to reduce the resistivity, and thus the generation of static electricity is suppressed. At this time, the amount of carbon particle or metallic particle to be added is preferably controlled such that the resistivity is $1\times10^6$ to $1\times10^{12}$ Ωm (preferably, $1\times10^{108}$ to $1\times10^{10}$ Ωm).

A light emitting layer 713 is formed on the pixel electrode 710. Note that, although only one pixel is shown in FIG. 14, light emitting layers corresponding to respective colors of R (red), G (green), and B (blue) are separately formed in this embodiment. Also, in this embodiment, a low molecular system organic light emitting material is formed by an evaporation method. Specifically, a laminate structure is used such that a copper phthalocyanine (CuPc) film having a thickness of 20 nm is provided as a hole injection layer and a tris-8-quinolinolato aluminum complex (Alq$_3$) film having a thickness of 70 nm is provided thereon as the light emitting layer. When a fluorescent coloring matter such as quinacridon, perylene, or DCM1 is added to Alq$_3$, a light emitting color can be controlled.

Note that the above materials are examples of the organic light emitting materials which can be used for the light emitting layer and the present invention is not limited to these materials. The light emitting layer (layer for effecting light emission and carrier transfer therefor) may be preferably formed by freely combining a light emitting layer, a charge transport layer, and a charge injection layer. For example, in this embodiment, an example in which the low molecular system organic light emitting material is used as the light emitting layer is described. However, a middle molecular system organic light emitting material or a polymer system organic light emitting material may be used. In this embodiment, an organic light emitting material which has no sublimation property and in which the number of molecules is 20 or smaller or a length of linked molecules is 10 µm or shorter is used as the middle molecular system organic light emitting material. With respect to an example in which the polymer system organic light emitting material is used, a laminate structure may be used such that a polythiophene (PEDOT) film having a thickness of 20 nm is provided as the hole injection layer by a spin coating method and a paraphenylenevinylene (PPV) film having a thickness of about 100 nm is provided thereon as the light emitting layer. When a π conjugate system polymer of PPV is used, a light emitting wavelength from a red color to a blue color can he selected. An inorganic material such as silicon carbide can be also used for the charge transport layer or the charge injection layer. Known materials can be used as the organic tight emitting material and the inorganic material.

Then, a cathode 714 made from a conductive film is provided on the light emitting layer 713. In the case of this embodiment, an alloy film of aluminum and lithium is used as the conductive film. Of course, a known MgAg film (alloy film of magnesium and silver) may be used. A conductive film made of an element belonging to group 1 or group 2 of the periodic table or a conductive film to which the element is added may be used as a cathode material.

When the cathode 714 is formed, a light emitting element 715 is completed. Note that the light emitting element 715 described here indicates a diode composed of the pixel electrode (anode) 710, the light emitting layer 713, and the cathode 714.

It is effective to provide a passivation film 716 so as to completely cover the light emitting element 715. The passivation film 716 is made from an insulating film including a carbon film, a silicon nitride film, or a silicon oxynitride film and used as a single layer of the insulating film or a laminate as a combination thereof.

At this time, a film having high coverage is preferably used as the passivation film and it is effective to use a carbon film, particularly, a DLC (diamond-like carbon) film. Since the DLC film can be formed in a temperature range of a room temperature to 100° C., it can be easily formed over the light emitting layer 713 having a low heat resistance. Also, the DLC film has a high blocking effect to oxygen and thus the oxidation of the light emitting layer 713 can be suppressed. Therefore, a problem such as the light emitting layer 713 is oxidized during a sealing step followed by this step can be solved.

Further, a sealing member 717 is provided on the passivation film 716 and a cover member 718 is bonded thereto. An ultraviolet curable resin may be used as the sealing member 717 and it is effective provide a material having a moisture absorption effect or a material having an antioxidant effect in the inner portion. In this embodiment, a glass substrate, a quartz substrate, or a plastic substrate (including a plastic film), in which a carbon film (preferably, a diamond-like carbon film) is formed on both surfaces is used as the cover member 718.

Thus, a light emitting device having the structure as shown in FIG. 14 is completed. Note that, it is effective that steps until the passivation film 716 is formed after the formation of the bank 712 are performed in succession without exposure to air by using a multi-chamber system (or in-line system) film formation apparatus. Further, subsequent steps up to bonding of the cover member 718 can be also performed in succession without exposure to air.

Thus, n-channel TFTs 601 and 602, a switching TFT (n-channel TFT) 603, and a current control TFT (n-channel TFT) 604 are formed over the substrate 700. The number of masks required for manufacturing steps until this point is smaller than that for a general active matrix light emitting device.

That is, manufacturing steps of TFTs are greatly simplified and the improvement of a yield and the reduction in a manufacturing cost can be realized.

Further, as described using FIG. 14, when the impurity regions overlapped with the gate electrode through the insulating film are provided, the n-channel TFT resistant to deterioration caused due to a hot carrier effect can be formed. Thus, the light emitting device having high reliability can be realized.

Also, in this embodiment, only the structures of the pixel portion and the driver circuit are indicated. However, according to the manufacturing steps of this embodiment, logical circuits such as a signal separating circuit, a D/A converter, an operational amplifier, a γ correction circuit, and the like can be also formed on the same insulator. In addition, a memory, and a microprocessor can be formed.

A light emitting device of this embodiment after a sealing (or enclosure) step for protecting the light emitting element is performed will be described using FIGS. 15A and 15B. Note that reference symbols used in FIG. 14 are referred to if necessary.

FIG. 15A is a top view indicating a state after the sealing of the light emitting element and FIG. 15B is a cross sectional view obtained by cutting FIG. 15A along the line C–C'. Reference numeral 801 indicated by a dot line denotes a source side driver circuit, 806 denotes a pixel portion, and 807 denotes a gate side driver circuit. Also, reference numeral 901 denotes a cover member, 902 denotes a first seal member, and 903 denotes a second seal member. A sealing member 907 is provided in the inside portion surrounded by the first seal member 902.

Note that reference numeral 904 denotes a wiring for transmitting signals inputted to the source side driver circuit 801 and the gate side driver circuit 807. The wiring 904 receives a video signal and a clock signal from an FPC (flexible printed circuit) 905 serving as an external input terminal. Although only the FPC is shown here, a printed wiring board (PWB) may be attached to the FPC. The light emitting device in this specification includes not only a main body of the tight emitting device but also the light emitting device to which the FPC or the PWB is attached.

Next, the cross sectional structure will be described using FIG. 15B. The pixel portion 806 and the gate side driver circuit 807 are formed over the substrate 700. The pixel portion 806 is composed of a plurality of pixels each including the current control TFT 604 and the pixel electrode 710 electrically connected with the drain thereof. The gate side driver circuit 807 is composed of a CMOS circuit (see FIG. 14) in which the n-channel TFT 601 and the p-channel TFT 602 are combined with each other.

The pixel electrode 710 serves as the anode of the light emitting element. The banks 712 are formed in both ends of the pixel electrode 710. The tight emitting layer 713 and the cathode 714 of the light emitting element are formed on the pixel electrode 710.

The cathode 714 also serves as a wiring common to all pixels and is electrically connected with the FPC 905 through a connection wiring 904. All elements which are included in the pixel portion 806 and the gate side driver circuit 807 are covered with the cathode 714 and a passivation film 716.

Also, the cover member 901 is bonded to the resultant substrate through the first seal member 902. Note that a spacer made froth a resin film may be provided to keep an interval between the cover member 901 and the light emitting element. The sealing member 907 is filled inside the first seal member 902. An epoxy system resin is preferably used for the first seal member 902 and the sealing member 907. The first seal member 902 is desirably made of a material that does not transmit moisture and oxygen as much as possible. A material having a moisture absorption effect or a material having an anti-oxidant effect may be included in the inner portion of the sealing member 907.

The sealing member 907 provided so as to cover the light emitting element also serves as an adhesive for bonding of the cover member 901. Also, in this embodiment, FRP (fiberglass-reinforced plastics), PVF (polyvinylfuroride), Mylar, polyester, or acrylic can be used as a material of the cover member 901.

Also, after bonding of the cover member 901 using the sealing member 907, the second seal member 903 is provided so as to cover side surfaces (exposed surface) of the sealing member 907. The second seal member 903 can be made of the same material as the first seal member 902.

With the above structure, when the light emitting element is sealed with the sealing member 907, the light emitting element can be completely shut from the outside and it can be prevented that a substance such as moisture or oxygen which promotes deterioration due to oxidation of the light emitting layer is entered from the outside. Therefore, the light emitting device having high reliability is obtained.

Note that this embodiment can be freely combined with Embodiments 1 to 5.

[Embodiment 9]

Figure 22:
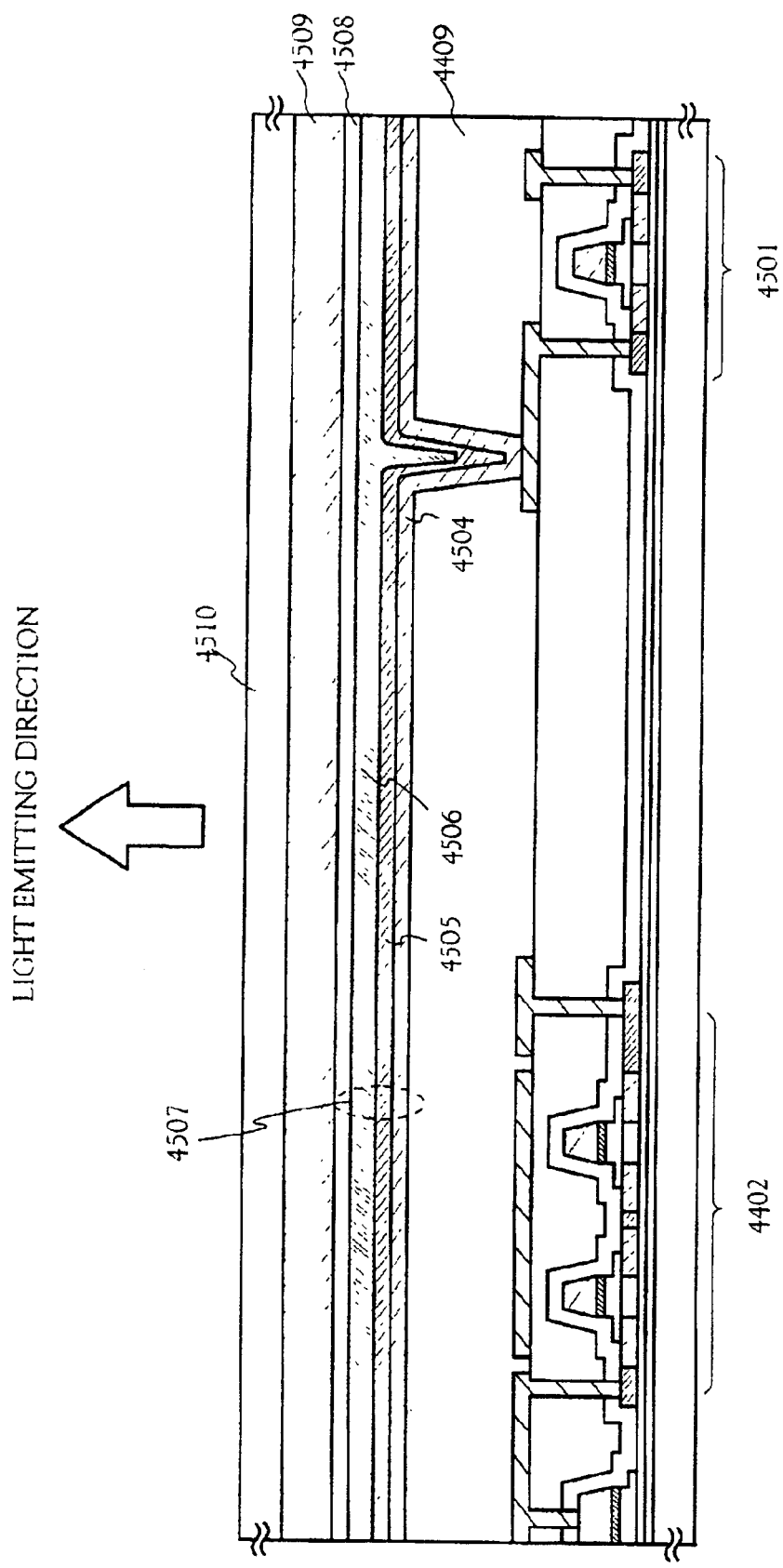
FIG. 22 is a cross sectional structural view of a pixel portion of a light emitting device of Embodiment 9.

In this embodiment, a light emitting device having a pixel structure different from Embodiment 8 will be described. FIG. 22 is used for the description.

In FIG. 22, a TFT having the same structure as the n-channel TFT 504 shown in FIG. 11 is used as a current control TFT 4501. Of course, the gate electrode of the current control TFT 4501 is electrically connected with a drain wiring of a switching TFT 4402. Also, the drain wiring of the current control TFT 4501 is electrically connected with a pixel electrode 4504.

In this embodiment, the pixel electrode 4504 made from a conductive film serves as the cathode of the light emitting element. Concretely, an alloy film of aluminum and lithium is used. A conductive film made of an element belonging to the group 1 or the group 2 of the periodic table or a conductive film to which the element is added is preferably used.

A light emitting layer 4505 is formed on the pixel electrode 4504. Note that, although only one pixel is shown in FIG. 22, a light emitting layer corresponding to G (green) is formed by an evaporation method and a coating method (preferably, a spin coating method) in this embodiment. Concretely, a laminate structure is used such that a lithium fluoride (LiF) film having a thickness of 20 nm is provided as an electron injection layer and a PPV (polyparaphenylenevinylene) film having a thickness of 70 nm is provided thereon as the light emitting layer.

Then, an anode 4506 made from a transparent conductive film is provided on the light emitting layer 4505. In the case of this embodiment, a conductive film made of a compound of indium oxide and tin oxide or a compound of indium oxide and zinc oxide is used as the transparent conductive film.

When the anode 4506 is formed, a light emitting element 4507 is completed. Note that the light emitting element 4507 described here indicates a diode composed of the pixel electrode (cathode) 4504, the light emitting layer 4505, and the anode 4506.

It is effective to provide a passivation film 4508 so as to completely cover the light emitting element 4507. The passivation film 4508 is made from an insulating film including a carbon film, a silicon nitride film, or a silicon oxynitride film and used as a single layer of the insulating film or a laminate as a combination thereof Further, a sealing member 4509 is provided on the passivation film 4508 and a cover member 4510 is bonded thereto. An ultraviolet curable resin is preferably used as the sealing member 4509 and it is effective to provide a material having a moisture absorption effect or a material having an anti-oxidant effect in the inner portion. In this embodiment, a glass substrate, a quartz substrate, or a plastic substrate (including a plastic film), in which a carbon film (preferably, a diamond-like carbon film) is formed on both surfaces is used as the cover member 4510.

Note that this embodiment can be freely combined with Embodiments 1 to 5.

[Embodiment 10]

The CMOS circuit and the pixel portion formed by implementing the invention can be used in various electric devices (active matrix type liquid crystal display, active matrix type EC display, active matrix type light emitting display). That is, the present invention can be implemented in all of electronic apparatuses integrated with the electric devices at display portions thereof.

As such electronic apparatus, there are pointed out a video camera, a digital camera, a projector, a head mount display (goggle type display), a car navigation system, a car stereo, a personal computer, a portable information terminal (mobile computer, portable telephone or electronic book) and the like. Examples of these are shown in FIGS. 16A through 16F, FIGS. 17A through 17D and FIGS. 18A through 18C.

Figure 16A:
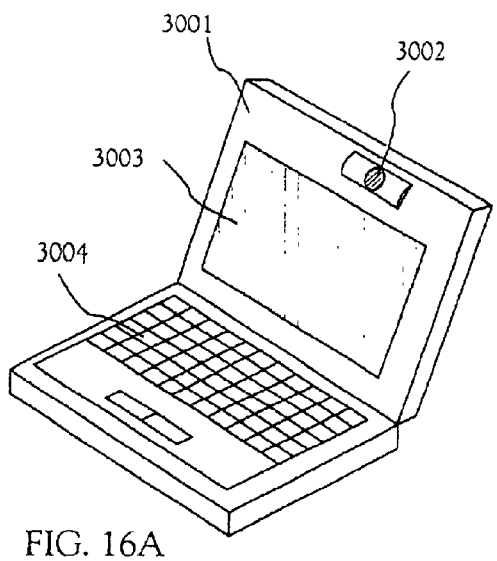
FIGS. 16A to 16F show examples of semiconductor devices of Embodiment 10.

FIG. 16A shows a personal computer including a main body 3001, an image input portion 3002, a display portion 3003 and a keyboard 3004. The invention is applicable to the display portion 3003.

Figure 16B:
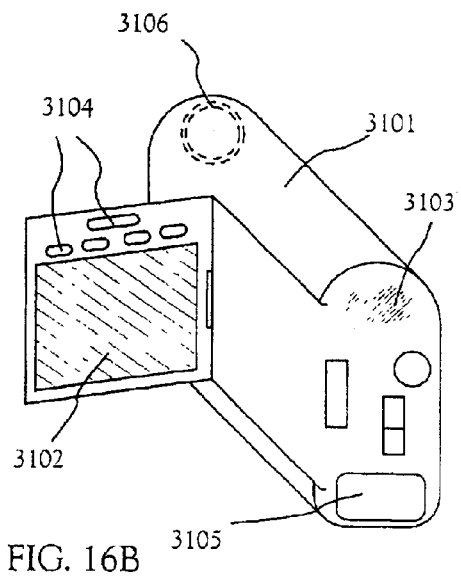

FIG. 16B shows a video camera including a main body 3101, a display portion 3102, a voice input portion 3103, operation switches 3104, a battery 3105 and an image receiving portion 3106. The invention is applicable to the display portion 3102.

Figure 16C:
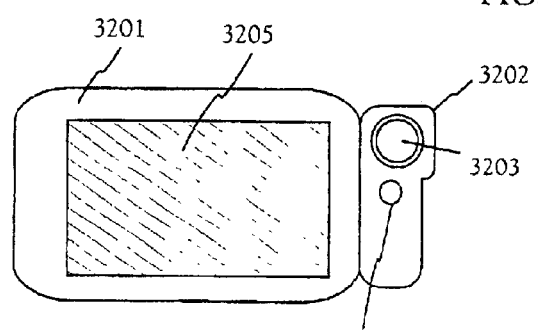

FIG. 16C shows a mobile computer including a main body 3201, a camera portion 3202, an image receiving portion 3203, an operation switch 3204 and a display portion 3205. The invention is applicable the display portion 3205.

Figure 16D:
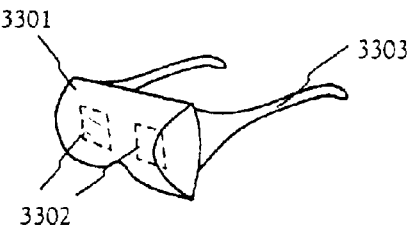

FIG. 16D shows a goggle type display including a main body 3301, a display portion 3302 and an arm portion 3303. The invention is applicable to the display portion 3302.

Figure 16E:
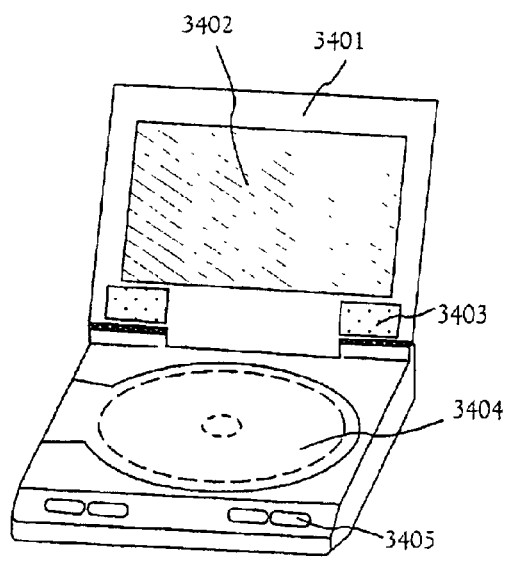

FIG. 16E shows a player using a record medium recorded with programs (hereinafter, referred to as record medium) including a main body 3401, a display portion 3402, a speaker portion 3403, a record medium 3404 and an operation switch 3405. The player uses DVD (Digital Versatile Disc) or CD as the record medium and can enjoy music, enjoy movie and carry out game or Internet. The invention is applicable to the display portion 3402.

Figure 16F:
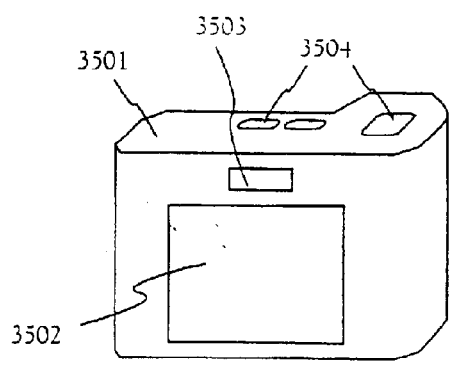

FIG. 16F shows a digital camera including a main body 3501, a display portion 3502, an eye contact portion 3503, operation switches 3504 and an image receiving portion (not illustrated). The invention is applicable to the display portion 3502.

Figure 17A:
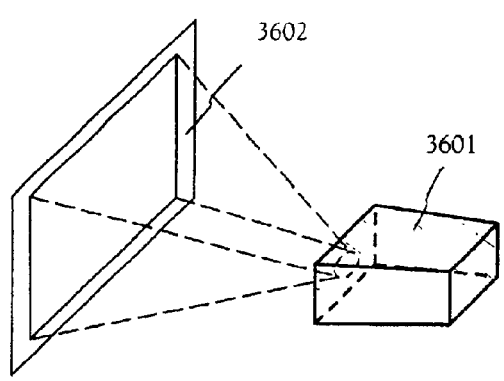
FIGS. 17A to 17D show examples of semiconductor devices of Embodiment 10.

FIG. 17A shows a front type projector including a projection apparatus 3601 and a screen 3602. The invention is applicable to a liquid crystal display apparatus 3808 constituting a portion of the projection apparatus 3601 and other driver circuit.

Figure 17B:
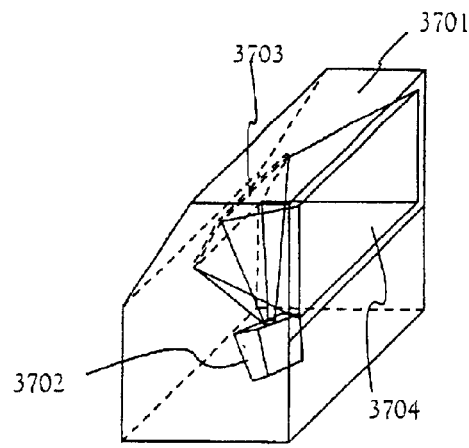

FIG. 17B shows a rear type projector including a main body 3701, a projection apparatus 3702, a mirror 3703 and a screen 3704. The invention is applicable to a liquid crystal display apparatus 3808 constituting a portion of the projection apparatus 3702 and other driver circuit.

Figure 17C:
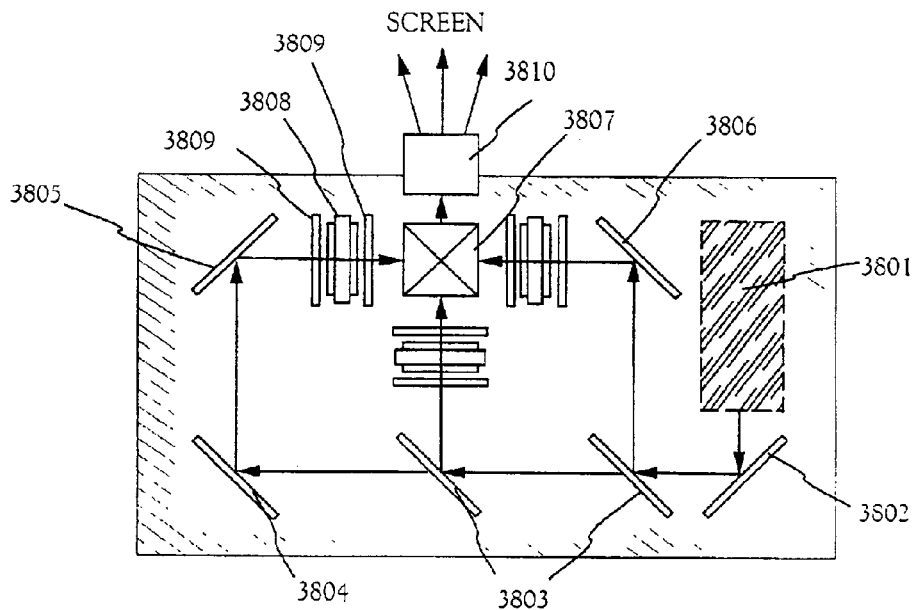

Further, FIG. 17C is a view showing an example of a structure of the projection apparatus 3601 and 3702 in FIG. 17A and FIG. 17B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 17C.

Figure 17D:
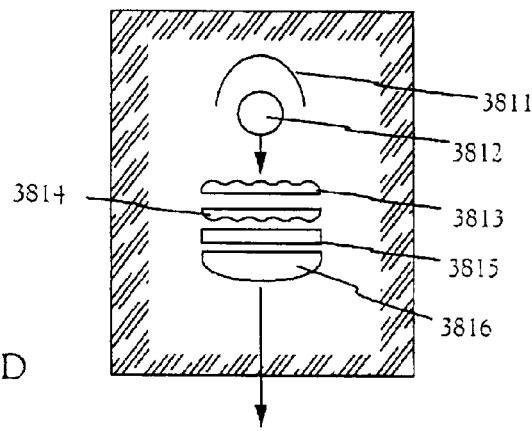

Further, FIG. 17D is a view showing an example of a structure of the light source optical system 3801 in FIG. 17C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 17D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 17A, 17B and 17C, there is shown a case of using a transmission type electronic apparatus and an example of applying a reflection type electronic apparatus is not illustrated.

Figure 18A:
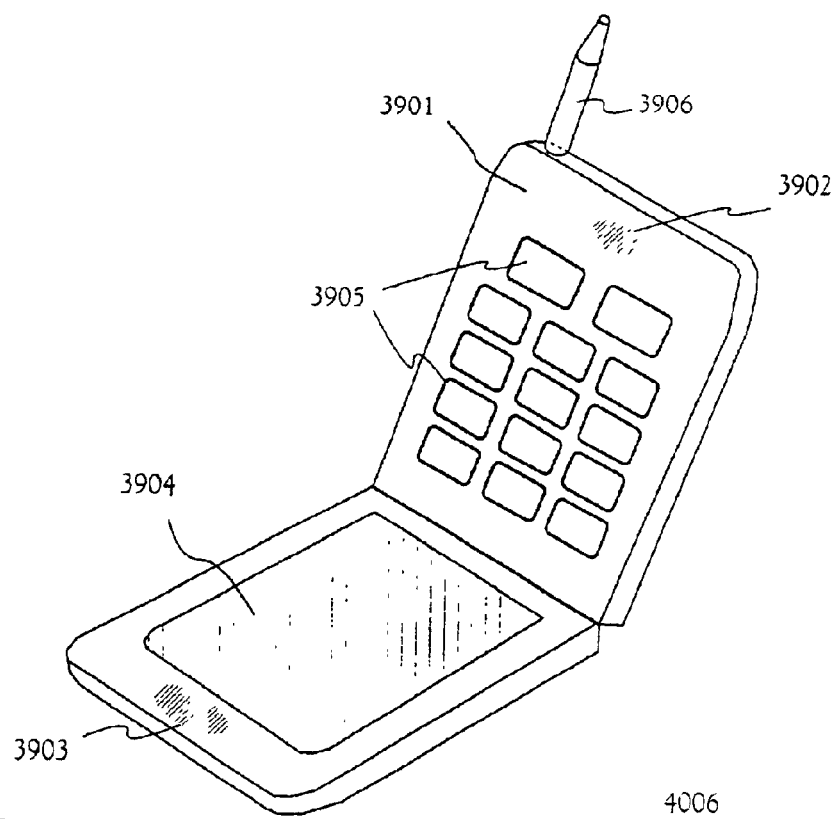
FIGS. 18A to 18C show examples of semiconductor devices of Embodiment 10.

FIG. 18A shows a portable telephone including a main body 3901, a voice output portion 3902, a voice input portion 3903, a display portion 3904, an operation switch 3905 and an antenna 3906. The invention is applicable to the display portion 3904.

Figure 18B:
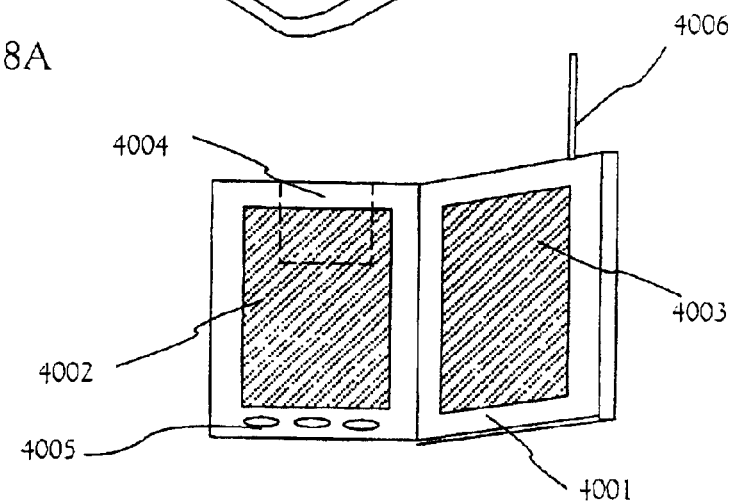

FIG. 18B shows a portable book (electronic book) including a main body 4001, display portions 4002 and 4003, a record medium 4004, an operation switch 4005 and an antenna 4006. The invention is applicable to the display portions 4002 and 4003.

Figure 18C:
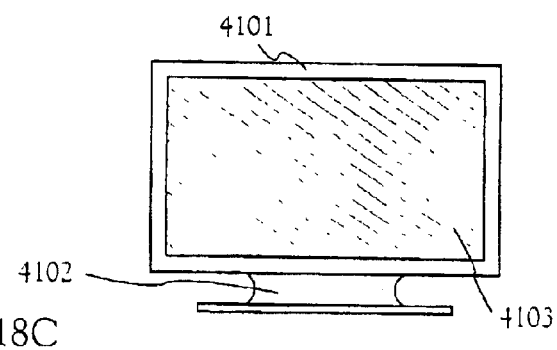

FIG. 18C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of Embodiments 1 to 9.

When the structure of the present invention is used, the following essential significance can be obtained.

(a) This is a simple structure that completely accords with a conventional TFT manufacturing process.

(b) The amount of impurity element to be introduced can be decreased. Thus, damage due to doping processing can be reduced in the gate insulating film, the semiconductor film, and the interface therebetween.

(c) The crystallinity of the semiconductor film into which the impurity element is introduced can be easily restored.

(d) The impurity element can be satisfactorily activated.

(e) The metallic element used for promoting crystallization can be satisfactorily removed.

(f) The width of the overlap regions between the gate electrode and the low concentration impurity regions can be shortened. Thus, a transistor can be further microfabricated.

(g) This is a method capable of manufacturing a TFT having a superior electrical characteristic obtained by attaining the above advantages.

What is claimed is:

1. A method of manufacturing a semiconductor device, said method comprising the steps of:

forming a semiconductor film over a first surface of a translucent substrate;

providing an element for promoting crystallization with the semiconductor film;

crystallizing the semiconductor film provided the element for promoting crystallization;

forming an insulating film on the semiconductor film;

forming a conductive film on the insulating film;

introducing at least one of noble gas elements and at least one of an element providing an n-time and an element providing a p-type into the semiconductor film;

performing thermal treatment for gettering the element for promoting crystallization;

irradiating with a first laser light from the first surface and with a second laser light from a second surface of the translucent substrate after the thermal treatment for gettering, wherein the second laser light is a portion of the first laser light which is transmitted through the translucent substrate and reflected by a reflector;

wherein the reflector is formed adjacent to the second surface of the translucent substrate.

2. A method according to claim 1, wherein the reflector has a curved surface to reflect the first laser light.

3. A method according to claim 1, wherein the reflector has rugged portions on a reflecting surface thereof to effect diffuse reflection of the first laser light.

4. A method according to claim 1, wherein each of the first and second laser lights has a wavelength in a range of 300 nm or more.

5. A method according to claim 1, wherein each of the first and second laser lights is one selected from the group consisting of a pulse oscillation type gas laser, a continuous light emitting type gas laser, a solid laser and a metallic laser.

6. A method according to claim 1, wherein the semiconductor device is one selected from the group consisting of an active matrix type liquid crystal display, an active matrix type EC display and an active matrix type light emitting display.

7. A method according to claim 1, wherein the semiconductor device is one selected from the group consisting of a personal computer, a video camera, a mobile computer, a goggle type display, a player using a record medium recorded with programs, a digital camera, a front type projector, a rear type projector, a, portable telephone, a portable book and a display.

8. A method of manufacturing a semiconductor device, said method comprising the steps of:

forming a semiconductor film over a first surface of a translucent substrate;

providing an element for promoting crystallization with the semiconductor film;

crystallizing the semiconductor film provided the element for promoting crystallization;

forming an insulating film on the semiconductor film;

forming a conductive film on the insulating film;

introducing at least one of noble gas elements and at least one of an element providing an n-type and an element providing a p-type into the semiconductor film;

performing thermal treatment for gettering the element for promoting crystallization;

irradiating with a first laser light from the first surface in a slant direction with respect to the translucent substrate and with a second laser light from a second surface of the translucent substrate after the thermal treatment for gettering, wherein the second laser light is a portion of the first laser light which is transmitted through the translucent substrate and reflected by a reflector;

wherein the reflector is formed adjacent to the second surface of the translucent substrate.

9. A method according to claim 8, wherein the reflector has a curved surface to reflect the first laser light.

10. A method according to claim 8, wherein the reflector has rugged portions on a reflecting surface thereof to effect diffuse reflection of the first laser light.

11. A method according to claim 8, wherein each of the first and second laser lights has a wavelength in a range of 300 nm or more.

12. A method according to claim 8, wherein each of the first and second laser lights is one selected from the group consisting of a pulse oscillation type gas laser, a continuous light emitting type gas laser, a solid laser and a metallic laser.

13. A method according to claim 8, wherein the semiconductor device is one selected from the group consisting of an active matrix type liquid crystal display, an active matrix type EC display and an active matrix type light emitting display.

14. A method according to claim 8, wherein the semiconductor device is one selected from the group consisting of a personal computer, a video camera, a mobile computer, a goggle type display, a player using a record medium recorded with programs, a digital camera, a front type projector, a rear type projector, a portable telephone, a portable book and a display.

* * * * *

UNITED STATES PATENT AND TRADEMARK OFFICE
CERTIFICATE OF CORRECTION

PATENT NO. : 6,809,012 B2 Page 1 of 1
APPLICATION NO. : 10/034498
DATED : October 26, 2004
INVENTOR(S) : Shunpei Yamazaki et al.

It is certified that error appears in the above-identified patent and that said Letters Patent is hereby corrected as shown below:

Col. 36, Claim 1, line 12, replace "n-time" with --n-type--.

Signed and Sealed this

Twenty-first Day of November, 2006

JON W. DUDAS
*Director of the United States Patent and Trademark Office*